United States Patent
Fujita et al.

(10) Patent No.: US 12,027,640 B2
(45) Date of Patent: Jul. 2, 2024

(54) SOLAR CELL ELEMENT AND METHOD FOR MANUFACTURING SOLAR CELL ELEMENT

(71) Applicant: KYOCERA Corporation, Kyoto (JP)

(72) Inventors: Kohei Fujita, Higashiomi (JP); Hirotaka Sano, Omihachiman (JP)

(73) Assignee: KYOCERA CORPORATION, Kyoto (JP)

( * ) Notice: Subject to any disclaimer, the term of this patent is extended or adjusted under 35 U.S.C. 154(b) by 269 days.

(21) Appl. No.: 17/433,602

(22) PCT Filed: Feb. 26, 2020

(86) PCT No.: PCT/JP2020/007566
§ 371 (c)(1),
(2) Date: Aug. 25, 2021

(87) PCT Pub. No.: WO2020/175501
PCT Pub. Date: Sep. 3, 2020

(65) Prior Publication Data
US 2022/0140169 A1   May 5, 2022

(30) Foreign Application Priority Data
Feb. 26, 2019 (JP) .................................. 2019-033164

(51) Int. Cl.
*H01L 31/074*    (2012.01)
*H01L 31/18*     (2006.01)

(52) U.S. Cl.
CPC ............ *H01L 31/074* (2013.01); *H01L 31/18* (2013.01)

(58) Field of Classification Search
CPC ....... H01L 31/074; H01L 31/18; H10K 30/40; H10K 30/57; Y02E 10/549; Y02P 70/50
See application file for complete search history.

(56) References Cited

U.S. PATENT DOCUMENTS

2008/0035965 A1* 2/2008 Hayashi ............ H01L 27/14605
                                                    257/440
2016/0285027 A1* 9/2016 Hosono ................... H10K 50/18

FOREIGN PATENT DOCUMENTS

JP          5005467 B2      8/2012
WO      2015098458 A1       7/2015

* cited by examiner

*Primary Examiner* — Devina Pillay
(74) *Attorney, Agent, or Firm* — HAUPTMAN HAM, LLP

(57) ABSTRACT

A solar cell element includes a first electrode, a second electrode, a light-absorbing layer, and a first carrier transporter. The light-absorbing layer is located between the first electrode and the second electrode. The first carrier transporter is located between the light-absorbing layer and the first electrode. The first carrier transporter includes a first semiconductor layer of a first conduction type and a first carrier introducing layer stacked in a direction from the light-absorbing layer toward the first electrode. The first carrier introducing layer is in contact with a surface of the first semiconductor layer nearer the first electrode. The first carrier introducing layer has an ionization potential smaller than an electron affinity of the first semiconductor layer.

14 Claims, 12 Drawing Sheets

SOLAR CELL ELEMENT AND METHOD FOR MANUFACTURING SOLAR CELL ELEMENT

CROSS-REFERENCE TO RELATED APPLICATION

The present application is a National Phase entry based on PCT Application No. PCT/JP2020/007566 filed on Feb. 26, 2020, entitled "SOLAR CELL ELEMENT AND METHOD OF PRODUCING SOLAR CELL ELEMENT", which claims the benefit of Japanese Patent Application No. 2019-033164, filed on Feb. 26, 2019, entitled "SOLAR CELL ELEMENT AND METHOD OF PRODUCING SOLAR CELL ELEMENT.

FIELD

Embodiments of the present disclosure relate generally to a solar cell element and a method for manufacturing a solar cell element.

BACKGROUND

A solar cell element may include a first electrode layer, an electron transport layer, a light-absorbing layer, a hole transport layer, and a second electrode layer stacked in this order (refer to, for example, Japanese Patent No. 5005467). For example, the electron transport layer transports electrons resulting from photoelectric conversion in the light-absorbing layer, and the hole transport layer transports holes resulting from photoelectric conversion in the light-absorbing layer.

SUMMARY

A solar cell element and a method for manufacturing a solar cell element are described.

In one embodiment, a solar cell element according to one aspect includes a first electrode, a second electrode, a light-absorbing layer, and a first carrier transporter. The light-absorbing layer is located between the first electrode and the second electrode. The first carrier transporter is located between the light-absorbing layer and the first electrode. The first carrier transporter includes a first semiconductor layer of a first conduction type and a first carrier introducing layer stacked in a direction from the light-absorbing layer toward the first electrode. The first carrier introducing layer is in contact with a surface of the first semiconductor layer nearer the first electrode. The first carrier introducing layer has an ionization potential smaller than an electron affinity of the first semiconductor layer.

In one embodiment, a solar cell element according to another aspect includes a first electrode, a second electrode, a light-absorbing layer, and a second carrier transporter. The light-absorbing layer is located between the first electrode and the second electrode. The second carrier transporter is located between the light-absorbing layer and the second electrode. The second carrier transporter includes a second semiconductor layer of a second conduction type and a second carrier introducing layer stacked in a direction from the light-absorbing layer toward the second electrode. The second carrier introducing layer is in contact with a surface of the second semiconductor layer nearer the second electrode. The second carrier introducing layer has an electron affinity larger than an ionization potential of the second semiconductor layer.

In one embodiment, a method for manufacturing a solar cell element according to one aspect includes (A) forming a first carrier transporter and (B) forming a first electrode. The (A) forming the first carrier transporter includes forming the first carrier transporter by stacking, on a light-absorbing layer, a first semiconductor layer and a first carrier introducing layer to place the first carrier introducing layer into contact with a surface of the first semiconductor layer facing away from the light-absorbing layer. The first carrier introducing layer has an ionization potential smaller than an electron affinity of the first semiconductor layer. The (B) forming the first electrode includes forming the first electrode on the first carrier transporter.

In one embodiment, a method for manufacturing a solar cell element according to another aspect includes (a) forming a second carrier transporter and (b) forming a second electrode. The (a) forming the second carrier transporter includes forming the second carrier transporter by stacking, on a light-absorbing layer, a second semiconductor layer and a second carrier introducing layer to place the second carrier introducing layer into contact with a surface of the second semiconductor layer facing away from the light-absorbing layer. The second carrier introducing layer has an electron affinity larger than an ionization potential of the second semiconductor layer. The (b) forming the second electrode includes forming the second electrode on the second carrier transporter.

DETAILED DESCRIPTION

Figure 1:
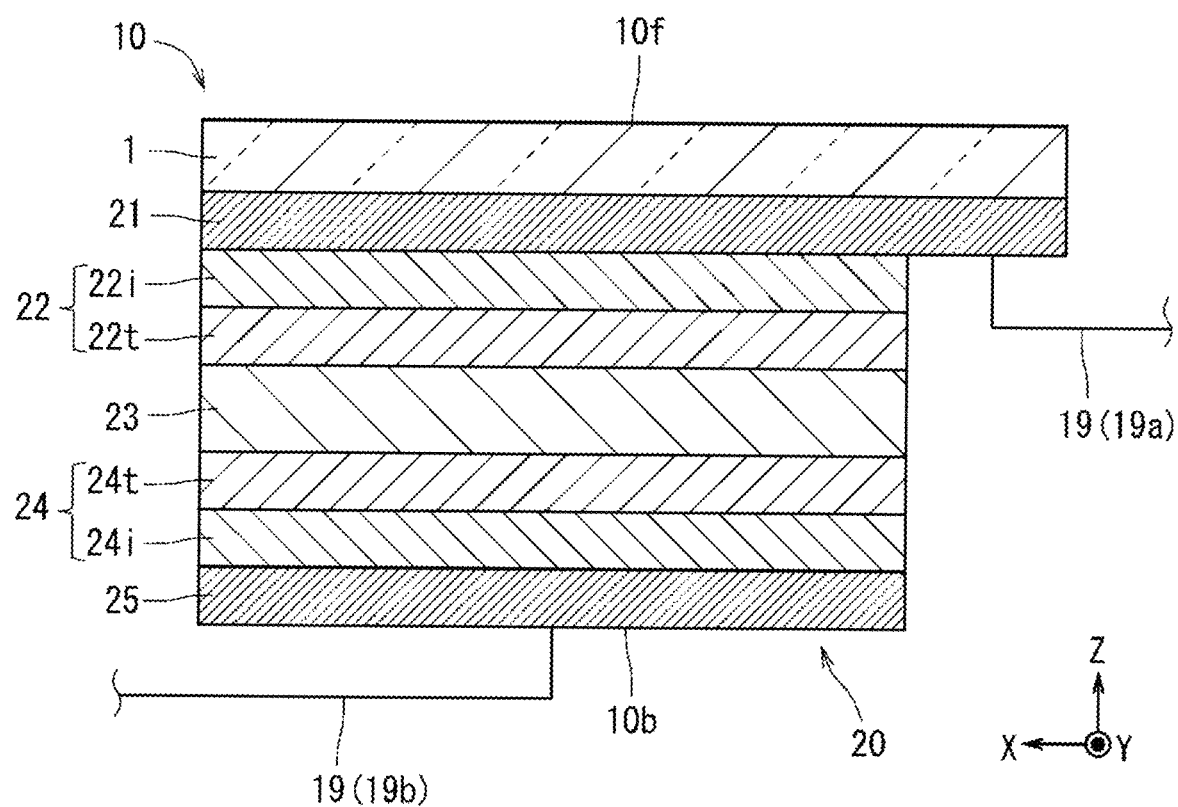
FIG. 1 illustrates a schematic cross-sectional view of an example solar cell element according to a first embodiment.

A solar cell element may include a first electrode layer, an electron transport layer, a light-absorbing layer, a hole transport layer, and a second electrode layer stacked in this order. For example, the electron transport layer transports electrons resulting from photoelectric conversion in the light-absorbing layer and blocks holes resulting from photoelectric conversion in the light-absorbing layer, and the hole transport layer transports holes resulting from photoelectric conversion in the light-absorbing layer and blocks electrons resulting from photoelectric conversion in the light-absorbing layer.

An electron transport layer and a hole transport layer are formed using, for example, doping in which an impurity element is added to a semiconductor material serving as a base material. Such doping includes a process of mixing an impurity element into a semiconductor material serving as a base material in a liquid phase (also referred to as a liquid phase process), and a process of mixing an impurity element into a semiconductor material serving as a base material in a gas phase (also referred to as a gas phase process). An example of the liquid phase process is film deposition including applying a liquid of a mixture of the semiconductor material and the impurity element onto the substrate to form the semiconductor layer into which the impurity element is mixed on the substrate. An example of the gas phase process is film deposition including simultaneously ejecting the impurity element and the semiconductor material serving as the base material by vapor deposition or sputtering to form, on the substrate, the semiconductor layer with the semiconductor material serving as the base material into which the impurity element is mixed.

For a p-type organic semiconductor material, for example, forming a semiconductor layer with the gas phase process may be inappropriate because a main chain of macromolecules may be cleaved before the organic semiconductor material vaporizes. In addition, in the liquid phase process, for example, a p-type organic semiconductor material serving as a base material and an impurity element cannot be uniformly mixed together.

For an inorganic semiconductor material or other materials, a semiconductor layer may be formed with the gas phase process. In this case, the impurity element and the semiconductor material serving as a base material can be relatively uniformly mixed in the semiconductor layer. The contact resistance and interface resistance between an electrode and a semiconductor layer may possibly be reduced by doping a high concentration of an impurity element into the entire semiconductor layer.

However, the impurity element contained at the high concentration in the semiconductor layer may have lower mobility and increase resistance loss. The high-concentration impurity element may serve as traps that prevent movement of carriers and cause carrier recombination, which may increase a loss (also referred to as a recombination loss).

The photoelectric conversion efficiency of solar cell elements remains to be improved.

The inventors of the present disclosure have developed a technique for improving the photoelectric conversion efficiency of solar cell elements.

Embodiments of the present disclosure will now be described with reference to the drawings. Throughout the drawings, components with the same structures and functions are given the same reference numerals and will not be described repeatedly. The drawings are schematic. FIGS. 1, 6A to 8, and 10 to 13 are expressed in a right-handed XYZ coordinate system, in which the direction normal to a first surface $10f$ of a solar cell device 10 is +Z direction, one direction parallel to the first surface $10f$ is +X direction, and a direction parallel to the first surface $10f$ and orthogonal to the +X and +Z directions is +Y direction.

1. First Embodiment

A solar cell device 10 according to a first embodiment will now be described with reference to FIGS. 1 to 4B.

As shown in FIG. 1, the solar cell device 10 includes a light receiving surface (also referred to as a first surface) $10f$ to mainly receive incident light, and a second surface $10b$ opposite to the first surface $10f$. In the first embodiment, the first surface $10f$ faces in the +Z direction serving as a first direction. The second surface $10b$ faces in the −Z direction serving as a second direction. The +Z direction is set to, for example, a direction toward the sun culminating in the south.

As shown in FIG. 1, the solar cell device 10 includes, for example, a substrate 1 and a solar cell element 20.

1-1. Solar Cell Element

The solar cell element 20 is located on the substrate 1. The solar cell element 20 includes, for example, a first electrode 21, a first carrier transporter 22, a light-absorbing layer 23, a second carrier transporter 24, and a second electrode 25. In the first embodiment, the first electrode 21, the first carrier transporter 22, the light-absorbing layer 23, the second carrier transporter 24, and the second electrode 25 are stacked in this order on the substrate 1. In other words, the first electrode 21, the first carrier transporter 22, the light-absorbing layer 23, the second carrier transporter 24, and the second electrode 25 are stacked in this order in the −Z direction serving as the second direction.

1-1-1. Substrate

The substrate 1 is, for example, a translucent insulating substrate. The substrate 1 allows, for example, light in a specific wavelength range to pass through it. Examples of the specific wavelength range include a wavelength range of light absorbable by the light-absorbing layer 23 to cause photoelectric conversion. Thus, for example, light with which the first surface $10f$ is irradiated can pass through the substrate 1 toward the light-absorbing layer 23. When, for example, the specific wavelength range includes a wavelength of light with high radiation intensity included in sunlight, the solar cell element 20 can increase electricity output. Examples of the material for the substrate 1 include glass, acryl, and polycarbonate. The substrate 1 may be a plate, a sheet, or a film. The thickness of the substrate 1 is, for example, within the range of about 0.01 to 5 millimeters (mm).

1-1-2. First Electrode

The first electrode 21 is located on the substrate 1. For example, the first electrode 21 can collect carriers resulting from photoelectric conversion in response to light irradiation in the light-absorbing layer 23. In the first embodiment, the first electrode 21 can serve as, for example, an electrode (also referred to as a negative electrode) that collects electrons serving as carriers. The first electrode 21 is, for example, translucent. As in the substrate 1, when the first electrode 21 allows light in a specific wavelength range to pass through it, light in the specific wavelength range can be incident on the first carrier transporter 22 through the substrate 1 and the first electrode 21. Examples of the material for the first electrode 21 include transparent conductive oxide (TCO) that allows light in a specific wavelength range to pass through it. Examples of TCO include indium tin oxide (ITO), fluorine-doped tin oxide (FTO), titanium dioxide ($TiO_2$), tin oxide (IV) ($SnO_2$), and zinc oxide (ZnO). An example of the first electrode 21 is a thin-film or layered electrode (also referred to as a first electrode layer). The thickness of the first electrode 21 is, for example, within the range of about 10 to 1000 nanometers (nm). When the second electrode 25 (described later) is translucent, the first electrode 21 may be opaque. Examples of the material for the opaque first electrode 21 include a highly conductive metal such as silver (Ag), gold (Au), copper (Cu), titanium (Ti), indium (In), and tin (Sn).

1-1-3. First Carrier Transporter

The first carrier transporter 22 is located between the first electrode 21 and the light-absorbing layer 23. For example, the first carrier transporter 22 can collect electrons serving as carriers resulting from photoelectric conversion in response to light irradiation in the light-absorbing layer 23 and output the electrons to the first electrode 21. In other words, the first carrier transporter 22 is a portion that transports carriers (electrons) (also referred to as an electron transporter). The first carrier transporter 22 also blocks, for example, entry of holes from the light-absorbing layer 23.

The first carrier transporter 22 includes, for example, a first semiconductor layer 22$t$ of a first conduction type and a first carrier introducing layer 22$i$. In the first embodiment, the first conduction type is an n-type. For example, the first semiconductor layer 22$t$ and the first carrier introducing layer 22$i$ are stacked in this order on the surface of the light-absorbing layer 23 nearer the first electrode 21. In other words, for example, the first semiconductor layer 22$t$ and the first carrier introducing layer 22$i$ are stacked in this order in the +Z direction serving as the first direction from the light-absorbing layer 23 toward the first electrode 21.

For example, the first semiconductor layer 22$t$ is located between the first electrode 21 and the light-absorbing layer 23. In the first embodiment, the first semiconductor layer 22$t$ is in contact with the light-absorbing layer 23. More specifically, for example, the first semiconductor layer 22$t$ is in contact with the surface of the light-absorbing layer 23 nearer the first electrode 21. An example of the first semiconductor layer 22$t$ is a semiconductor layer of a transparent inorganic material. Examples of the inorganic material include $TiO_2$, $SnO_2$, ZnO, and indium oxide ($In_2O_3$). For example, the first semiconductor layer 22$t$ has carriers (electrons) introduced from the first carrier introducing layer 22$i$. The first semiconductor layer 22$t$ may include, for example, an element (also referred to as a dopant) for introducing carriers (electrons) into a semiconductor of an inorganic material as a main component. Examples of a dopant for an oxide of the group II metal (such as ZnO) include one or more group III elements such as aluminum (Al), gallium (Ga), and indium (In). Examples of a dopant for an oxide of the group III metal (such as $In_2O_3$) include one or more group IV elements such as titanium (Ti) and tin (Sn). Examples of a dopant for an oxide of the group IV metal (such as $TiO_2$ and $SnO_2$) include one or more group V elements such as niobium (Nb) and antimony (Sb). The main component refers to the component with the highest ratio (also referred to as a content) of all the contained constituents.

The first carrier introducing layer 22$i$ is in contact with, for example, the first semiconductor layer 22$t$. In the first embodiment, for example, the first carrier introducing layer 22$i$ is in contact with the surface of the first semiconductor layer 22$t$ nearer the first electrode 21. The first carrier introducing layer 22$i$ is in contact with, for example, the first electrode 21. In other words, the first electrode 21, the first carrier introducing layer 22$i$, and the first semiconductor layer 22$t$ are stacked in this order on the substrate 1. In other words, the first electrode 21, the first carrier introducing layer 22$i$, and the first semiconductor layer 22$t$ are stacked in this order in the −Z direction serving as the second direction.

The first carrier introducing layer 22$i$ has, for example, an ionization potential smaller than an electron affinity in the first semiconductor layer 22$t$. Thus, the first carrier introducing layer 22$i$ can serve as a layer that introduces electrons serving as carriers into the first semiconductor layer 22$t$ (also referred to as an electron introducing layer). This structure can avoid, for example, increasing the impurity element density in the first semiconductor layer 22$t$, and allows the first carrier introducing layer 22$i$ in contact with the first semiconductor layer 22$t$ to introduce electrons into the first semiconductor layer 22$t$ to increase, for example, the electron density (also referred to as carrier density) in the first semiconductor layer 22$t$. This structure reduces the likelihood of, for example, increasing the resistance loss and recombination loss in the first semiconductor layer 22$t$. Thus, for example, the solar cell element 20 can improve photoelectric conversion efficiency. In a semiconductor layer as the first carrier introducing layer 22$i$, for example, the first carrier introducing layer 22$i$ increases the density of holes serving as carriers after electrons are introduced into the first semiconductor layer 22$t$, thus reducing the resistance loss. This may reduce, for example, electric resistance at the interface between the first carrier transporter 22 and the first electrode 21.

Examples of the material for the first carrier introducing layer 22$i$ include cesium carbonate ($Cs_2CO_3$), lithium fluoride (LiF), and calcium (Ca).

Figure 2:
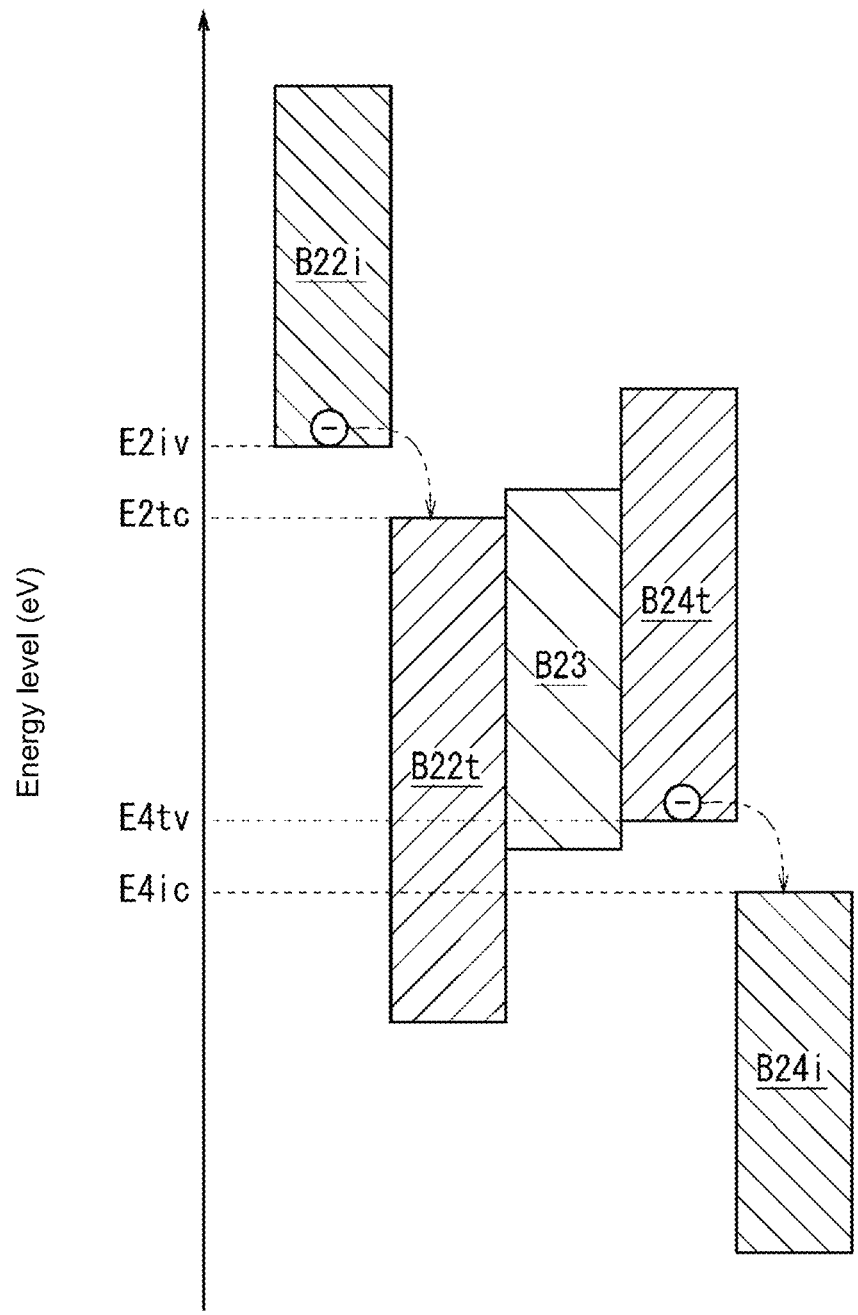
FIG. 2 illustrates a diagram showing energy bands of a first carrier introducing layer, a first semiconductor layer, a light-absorbing layer, a second semiconductor layer, and a second carrier introducing layer, showing an example relationship between the energy levels of these layers.

As shown in FIG. 2, for example, the first carrier introducing layer 22$i$ is formed from a material with a forbidden band B22$i$, such as a semiconductor. When an energy level E2$iv$ at the boundary between the forbidden band B22$i$ and a valence band in the first carrier introducing layer 22$i$ is higher than an energy level E2tc at the boundary between a forbidden band B22t and a conduction band in the first semiconductor layer 22t, electrons are introduced from the first carrier introducing layer 22i into the first semiconductor layer 22t. When, for example, electrons are introduced from the first carrier introducing layer 22i into the first semiconductor layer 22t, holes are left in the first carrier introducing layer 22i. The energy level E2iv corresponds to the upper end of the energy level of the valence band (valence band maximum (VBM) or highest occupied molecular orbital (HOMO) level) in the first carrier introducing layer 22i. The energy level E2tc corresponds to the lower end of the energy level of the conduction band (conduction band minimum (CBM) or lowest unoccupied molecular orbital (LUMO) level) in the first semiconductor layer 22t. The difference between the vacuum level and the upper end of the energy level of the valence band (VBM or HOMO level) in the first carrier introducing layer 22i corresponds to the ionization potential of the first carrier introducing layer 22i. The difference between the vacuum level and the lower end of the energy level of the conduction band (CBM or LUMO level) in the first semiconductor layer 22t corresponds to the electron affinity of the first semiconductor layer 22t. For example, the CBM or LUMO level of the first semiconductor layer 22t is set within the range of about −3.7 to −4.2 eV, and $Cs_2CO_3$ with the VBM or HOMO level of about −3.0 eV is used as the first carrier introducing layer 22i.

Figure 3:
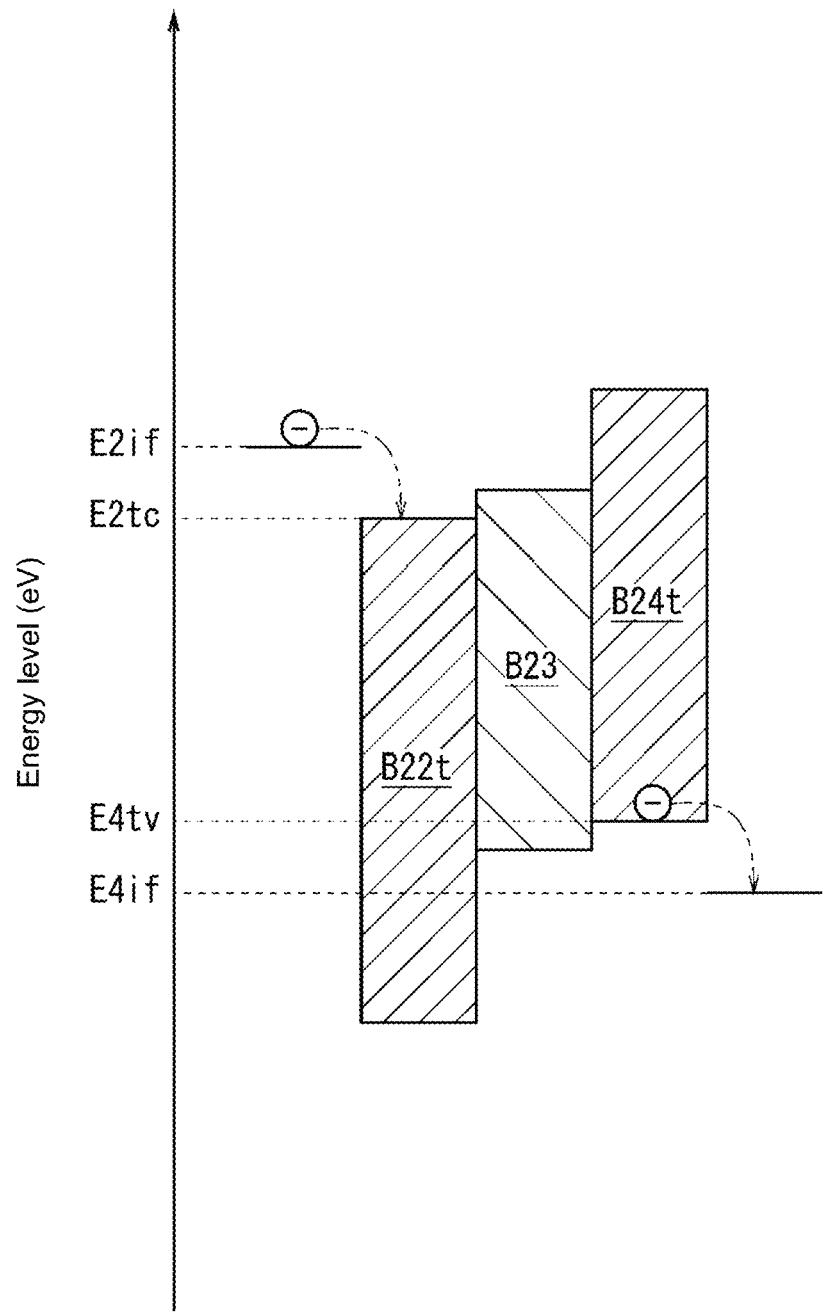
FIG. 3 illustrates a diagram showing the ionization potential and the electron affinity of the first carrier introducing layer, the first semiconductor layer, the light-absorbing layer, the second semiconductor layer, and the second carrier introducing layer, showing example relationships between these layers.

As shown in FIG. 3, for example, the material for the first carrier introducing layer 22i is a conductive material with no forbidden band B22i, such as metal. When a Fermi level E2if of the first carrier introducing layer 22i is higher than the energy level E2tc at the boundary between the forbidden band B22t and the conduction band in the first semiconductor layer 22t, electrons can be introduced from the first carrier introducing layer 22i into the first semiconductor layer 22t. When electrons are introduced from the first carrier introducing layer 22i into the first semiconductor layer 22t, holes can be left in the first carrier introducing layer 22i. The difference between the vacuum level and the Fermi level E2if of the first carrier introducing layer 22i corresponds to the ionization potential and the electron affinity of the first carrier introducing layer 22i.

For example, the first carrier introducing layer 22i as a thin film with a thickness of about 1 to 5 nm is less likely to increase electric resistance against movement of electrons from the light-absorbing layer 23 toward the first electrode 21. With the first semiconductor layer 22t having a thickness of smaller than or equal to a Debye length of the semiconductor material forming the first semiconductor layer 22t, for example, the first carrier introducing layer 22i can introduce carriers (electrons) into the first semiconductor layer 22t across the entire thickness. The Debye length $\lambda_D$ indicates the range over which an electric field expands in a semiconductor material. The Debye length $\lambda_D$ can be expressed with formula (1), where the relative dielectric constant is ε, the Boltzmann constant is $K_B$, the temperature is T, the carrier density is n, and the elementary electric charge is e.

$$\lambda_D = \sqrt{(\varepsilon K_B T / n e^2)} \quad (1)$$

When, for example, the relative dielectric constant ε is within the range of 1 to 100, the carrier density n is within the range of about $1 \times 10^{16}$ to $1 \times 10^{18}$ cm$^{-3}$, and the temperature T is a normal temperature of 300 degrees kelvin (K), the Debye length $\lambda_D$ is calculated to be within the range of about 1 to 100 nm. In this structure, the thickness of the first semiconductor layer 22t is within the range of about 1 to 100 nm. The carrier density n includes the density of carriers (electrons) due to a loss of elements and the impurity element in the first semiconductor layer 22t and the density of carriers (electrons) introduced from the first carrier introducing layer 22i into the first semiconductor layer 22t. When, for example, the material for the first semiconductor layer 22t is an organic material, the carrier density n is a density of carriers (electrons) introduced from the first carrier introducing layer 22i into the first semiconductor layer 22t. For example, the movement of carriers (electrons) from the first carrier introducing layer 22i to the first semiconductor layer 22t causes a Coulomb potential due to charge distribution. The Coulomb potential prevents further movement of carriers (electrons) from the first carrier introducing layer 22i to the first semiconductor layer 22t. Thus, an actual carrier density n in the first semiconductor layer 22t can be determined in accordance with, for example, the balance between the Coulomb potential and the difference between the electron affinity of the first semiconductor layer 22t and the ionization potential of the first carrier introducing layer 22i.

In the first embodiment, as described above, the first carrier transporter 22 has a simple structure including the first carrier introducing layer 22i and the first semiconductor layer 22t stacked a single time in the −Z direction serving as the second direction. Thus, the solar cell element 20 can be manufactured easily. In addition, for example, the contact resistance is less likely to increase between the first carrier introducing layer 22i and the first semiconductor layer 22t. Thus, for example, the solar cell element 20 can easily improve photoelectric conversion efficiency.

1-1-4. Light-Absorbing Layer

The light-absorbing layer 23 is located between the first electrode 21 and the second electrode 25. In the first embodiment, the light-absorbing layer 23 is located on the first carrier transporter 22. In other words, the light-absorbing layer 23 is located over the first electrode 21 with the first carrier transporter 22 including the first semiconductor layer 22t between them.

The light-absorbing layer 23 can absorb, for example, light passing through the substrate 1, the first electrode 21, and the first carrier transporter 22. In the first embodiment, an intrinsic semiconductor (also referred to as an i-type semiconductor) is used as the light-absorbing layer 23. Examples of the i-type semiconductor include a semiconductor with a perovskite structure (also referred to as a perovskite semiconductor). Examples of the perovskite semiconductor include a halide perovskite semiconductor of an $ABX_3$ composition where A, B, and X ions are coupled. Examples of the A ion include one or more organic ions such as a methylammonium ion ($MA^+$), a formamidinium ion ($FA^+$), and a guanidinium ion ($GA^+$), and one or more inorganic ions such as a cesium ion ($Cs^+$), a rubidium ion ($Rb^+$), and a potassium ion ($K^+$). For example, the A ion may simply include one or more organic cations, simply one or more inorganic ions, or a mixture of one or more organic cations and one or more inorganic ions. An organic cation including an amine group may be used as an example of the organic cation. A semiconductor with a perovskite structure including an amine group can increase the photoelectric conversion efficiency of the light-absorbing layer 23. Thus, the solar cell element 20 can improve photoelectric conversion efficiency. A metal ion of one or more group 14 (group IV-A) elements such as a lead ion ($Pb^{2+}$) and a tin ion ($Sn^{2+}$) is used as the B ion. One or more halide ions such as an iodine ion ($I^-$), a bromine ion ($Br^-$), and a chloride ion ($Cl^-$) are used as the X ion.

As shown in FIGS. 2 and 3, the VBM or HOMO level serving as the energy level at the boundary between the forbidden band B23 and the valence band of the light-absorbing layer 23 is, for example, higher than or equal to the VBM or HOMO level of the first semiconductor layer 22t. The CBM or LUMO level serving as the energy level at the boundary between the forbidden band B23 and the conduction band of the light-absorbing layer 23 is higher than or equal to the CBM or LUMO level of the first semiconductor layer 22t.

The thickness of the light-absorbing layer 23 is, for example, within the range of about 100 to 2000 nm. In other words, the thickness of the light-absorbing layer 23 is larger than, for example, the thickness of the first semiconductor layer 22t and the thickness of a second semiconductor layer 24t. Thus, the light-absorbing layer 23 can fully absorb light passing through, for example, the substrate 1, the first electrode 21, and the first carrier transporter 22.

1-1-5. Second Carrier Transporter

The second carrier transporter 24 is located between the light-absorbing layer 23 and the second electrode 25. In the first embodiment, the second carrier transporter 24 can collect holes serving as carriers resulting from photoelectric conversion in response to light irradiation in the light-absorbing layer 23 to output the holes to the second electrode 25. In other words, the second carrier transporter 24 is a portion that transports carriers (holes) (also referred to as a hole transporter). The second carrier transporter 24 also blocks, for example, entry of electrons from the light-absorbing layer 23.

The second carrier transporter 24 includes, for example, a second semiconductor layer 24t of a second conduction type and a second carrier introducing layer 24i. In the first embodiment, the second conduction type is a p-type. For example, the second semiconductor layer 24t and the second carrier introducing layer 24i are stacked in this order on the surface of the light-absorbing layer 23 nearer the second electrode 25. In other words, for example, the second semiconductor layer 24t and the second carrier introducing layer 24i are stacked in this order in the –Z direction serving as the second direction from the light-absorbing layer 23 toward the second electrode 25. In other words, for example, the second carrier introducing layer 24i is in contact with the surface of the second semiconductor layer 24t nearer the second electrode 25.

For example, the second semiconductor layer 24t is located between the light-absorbing layer 23 and the second electrode 25. In the first embodiment, the second semiconductor layer 24t is in contact with the surface of the light-absorbing layer 23 nearer the second electrode 25. A semiconductor layer of an organic material is used as the second semiconductor layer 24t. Examples of the organic material include spiro-OMeTAD, poly(3-hexylthiophene) (P3HT), poly(triaryl amine) (PTAA), and poly-TPD. For example, the second semiconductor layer 24t has carriers (holes) introduced from the second carrier introducing layer 24i. The second semiconductor layer 24t can be formed by applying a liquid material onto the light-absorbing layer 23 and then drying and annealing the applied liquid material.

The second carrier introducing layer 24i is in contact with, for example, the second semiconductor layer 24t. In the first embodiment, for example, the second carrier introducing layer 24i is in contact with the second electrode 25. In other words, the second carrier introducing layer 24i and the second semiconductor layer 24t are stacked in this order on the second electrode 25. In other words, the second carrier introducing layer 24i and the second semiconductor layer 24t are stacked in this order in the +Z direction serving as the first direction.

The second carrier introducing layer 24i has, for example, an electron affinity higher than the ionization potential of the second semiconductor layer 24t. Thus, the second carrier introducing layer 24i can serve as, for example, a layer that introduces holes serving as carriers into the second semiconductor layer 24t (also referred to as a hole introducing layer). This structure can avoid, for example, increasing the impurity element density in the second semiconductor layer 24t, and allows the second carrier introducing layer 24i in contact with the second semiconductor layer 24t to introduce holes into the second semiconductor layer 24t to increase, for example, the hole density (also referred to as carrier density) in the second semiconductor layer 24t. This structure reduces the likelihood of, for example, increasing the resistance loss and recombination loss in the second semiconductor layer 24t. Thus, for example, the solar cell element 20 can improve photoelectric conversion efficiency. In a semiconductor layer as the second carrier introducing layer 24i, for example, the second carrier introducing layer 24i increases the density of electrons serving as carriers after electrons move to the second carrier introducing layer 24i from the second semiconductor layer 24t, thus reducing the resistance loss. This may reduce, for example, electric resistance at the interface between the second carrier transporter 24 and the second electrode 25.

Examples of the material for the second carrier introducing layer 24i include metal oxide such as molybdenum oxide ($MoO_3$), tungsten oxide ($WO_3$), and vanadium oxide ($V_2O_5$), and other materials such as ruthenium oxide ($RuO_2$) and iron chloride ($FeCl_3$).

As shown in FIG. 2, for example, the second carrier introducing layer 24i is formed from a material with a forbidden band B24i, such as a semiconductor. When an energy level E4ic at the boundary between the forbidden band B24i and the conduction band of the second carrier introducing layer 24i is lower than an energy level E4tv at the boundary between the forbidden band B24t and the valence band of the second semiconductor layer 24t, electrons move from the second semiconductor layer 24t to the second carrier introducing layer 24i. Thus, holes are introduced into the second semiconductor layer 24t by the second carrier introducing layer 24i. The energy level E4tv corresponds to the upper end of the energy level of the valence band (VBM or HOMO level) in the second semiconductor layer 24t. The energy level E4ic corresponds to the lower end of the energy level of the conduction band (CBM or LUMO level) in the second carrier introducing layer 24i. The difference between the vacuum level and the lower end of the energy level of the conduction band (CBM or LUMO level) in the second carrier introducing layer 24i corresponds to the electron affinity of the second carrier introducing layer 24i. The difference between the vacuum level and the upper end of the energy level of the valence band (VBM or HOMO level) in the second semiconductor layer 24t corresponds to the ionization potential of the second semiconductor layer 24t. For example, the VBM or HOMO level of the second semiconductor layer 24t is set within the range of about −5.0 to −5.5 eV, and $MoO_3$ with the CBM or LUMO level of about −6.7 eV is used as the second carrier introducing layer 24i.

As shown in FIG. 3, for example, the material for the second carrier introducing layer 24i is a conductive material with no forbidden band B24i, such as metal. When a Fermi level E4if of the second carrier introducing layer 24i is lower than the energy level (VBM or HOMO level) E4$tv$ at the boundary between the forbidden band B24$t$ and the valence band of the second semiconductor layer 24$t$, electrons move from the second semiconductor layer 24$t$ to the second carrier introducing layer 24$i$. When electrons move from the second semiconductor layer 24$t$ to the second carrier introducing layer 24$i$, holes can be left in the second semiconductor layer 24$t$. The difference between the vacuum level and the Fermi level E4$if$ of the second carrier introducing layer 24$i$ corresponds to the ionization potential and the electron affinity of the second carrier introducing layer 24$i$.

For example, the second carrier introducing layer 24$i$ as a thin film with a thickness of about 1 to 5 nm is less likely to increase electric resistance against movement of holes from the light-absorbing layer 23 toward the second electrode 25. With the second semiconductor layer 24$t$ having a thickness of smaller than or equal to a Debye length $\lambda_D$ of the semiconductor material forming the second semiconductor layer 24$t$, for example, the second carrier introducing layer 24$i$ can introduce carriers (holes) into the second semiconductor layer 24$t$ across the entire thickness. The Debye length $\lambda_D$ can be expressed with formula (1) above.

When, for example, the relative dielectric constant c is within the range of 1 to 100, the carrier density n is within the range of about $1\times10^{16}$ to $1\times10^{18}$ cm$^{-3}$, and the temperature T is a normal temperature of 300 degrees K, the Debye length $\lambda_D$ is calculated to be within the range of about 1 to 100 nm. In this structure, the thickness of the second semiconductor layer 24$t$ is within the range of about 1 to 100 nm. When, for example, the material for the second semiconductor layer 24$t$ is an organic material, the carrier density n is the density of carriers (holes) introduced from the second carrier introducing layer 24$i$ into the second semiconductor layer 24$t$. When, for example, the material for the second semiconductor layer 24$t$ is an inorganic material, the carrier density n includes the density of carriers (holes) due to a loss of elements and the impurity element in the second semiconductor layer 24$t$ and the density of carriers (holes) introduced from the second carrier introducing layer 24$i$ into the second semiconductor layer 24$t$. However, introducing carriers (holes) from the second carrier introducing layer 24$i$ into the second semiconductor layer 24$t$ causes a Coulomb potential due to charge distribution. The Coulomb potential prevents further movement of carriers (holes) from the second carrier introducing layer 24$i$ to the second semiconductor layer 24$t$. Thus, an actual carrier density n in the second semiconductor layer 24$t$ can be determined in accordance with, for example, the balance between the Coulomb potential and the difference between the electron affinity of the second carrier introducing layer 24$i$ and the ionization potential of the second semiconductor layer 24$t$.

In the first embodiment, as described above, the second carrier transporter 24 has a simple structure including, for example, the second semiconductor layer 24$t$ and the second carrier introducing layer 24$i$ stacked a single time in the −Z direction serving as the second direction. Thus, the solar cell element 20 can be manufactured easily. In addition, for example, the contact resistance is less likely to increase between the second semiconductor layer 24$t$ and the second carrier introducing layer 24$i$. Thus, for example, the solar cell element 20 can easily improve photoelectric conversion efficiency.

1-1-6. Second Electrode

The second electrode 25 is located on the second carrier transporter 24. In the first embodiment, for example, the second electrode 25 is in contact with the second carrier introducing layer 24$i$ in the second carrier transporter 24. The second electrode 25 can serve as an electrode (also referred to as a positive electrode) that can collect holes serving as carriers resulting from photoelectric conversion in response to light irradiation in the light-absorbing layer 23. Examples of the material for the second electrode 25 include a highly conductive metal, such as Au, and TCO. Examples of TCO include ITO, FTO, and ZnO. An example of the second electrode 25 is a thin-film or layered electrode (also referred to as a second electrode layer). The thickness of the second electrode 25 is, for example, within the range of about 10 to 1000 nm. When TCO is used as the material for the second electrode 25, the second electrode 25 allows light in a specific wavelength range to pass through it. For example, light with which the second surface 10$b$ is irradiated can pass through the second electrode 25 toward the light-absorbing layer 23. Thus, besides the first surface 10$f$, the second surface 10$b$ can be the light receiving surface in the solar cell element 20.

For example, a wire 19 such as a lead wire is electrically connected to each of the first electrode 21 and the second electrode 25. More specifically, for example, a first wire 19$a$ is electrically connected to the first electrode 21, and a second wire 19$b$ is connected to the second electrode 25. Each wire 19 is joined to the corresponding one of the first electrode 21 and the second electrode 25 by, for example, soldering. For example, the solar cell element 20 can obtain outputs resulting from photoelectric conversion through the first wire 19$a$ and the second wire 19$b$.

1-1-7. Carrier Movement in Carrier Transporter

Movement of carriers in the first carrier transporter 22 and the second carrier transporter 24 will now be described using the second carrier transporter 24 as an example.

Figure 4A:
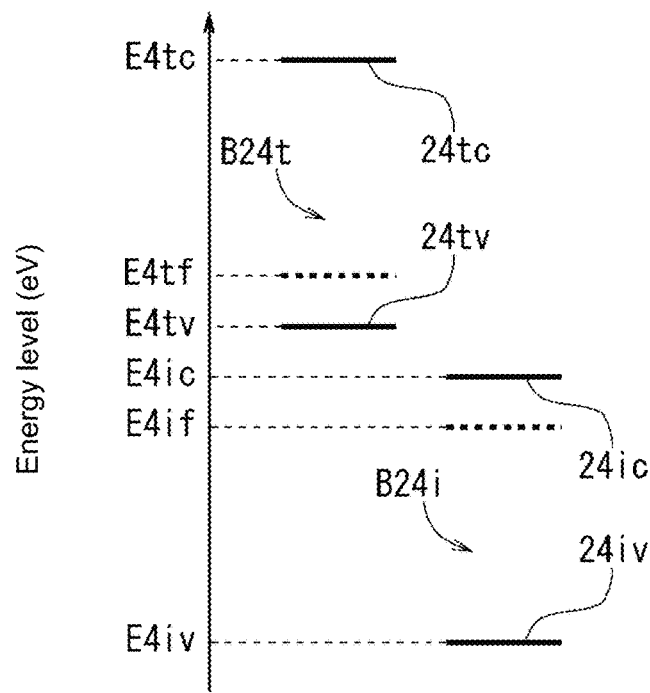
FIG. 4A illustrates a diagram showing example energy bands of the second semiconductor layer and the second carrier introducing layer that are not in contact with each other.

In the example below, the second semiconductor layer 24$t$ and the second carrier introducing layer 24$i$ are not joined. As shown in FIG. 4A, the second semiconductor layer 24$t$ has an energy level E4$tv$ at a boundary 24$tv$ between a forbidden band B24$t$ and the valence band, an energy level E4$tc$ at a boundary 24$tc$ between the forbidden band B24$t$ and the conduction band, and a Fermi level E4$tf$. The second carrier introducing layer 24$i$ has an energy level E4$iv$ at a boundary 24$iv$ between the forbidden band B24$i$ and the valence band, an energy level E4$ic$ at a boundary 24$ic$ between the forbidden band B24$i$ and the conduction band, and a Fermi level E4$if$.

Figure 4B:
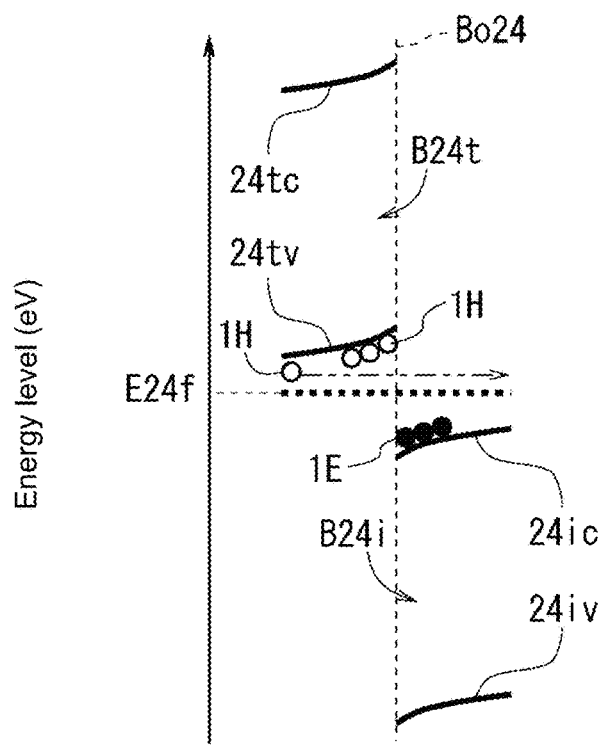
FIG. 4B illustrates a diagram showing example energy bands at a junction interface between the second semiconductor layer and the second carrier introducing layer and the surroundings of the junction interface.

As in the first embodiment, the second semiconductor layer 24$t$ and the second carrier introducing layer 24$i$ are joined in the example below. Holes in the second semiconductor layer 24$t$ and electrons in the second carrier introducing layer 24$i$ are exchanged. Thus, as shown in FIG. 4B, more holes 1H serving as the carriers are introduced into the valence band in a portion in the second semiconductor layer 24$t$ located nearer the interface (also referred to as a junction interface) Bo24 where the second semiconductor layer 24$t$ and the second carrier introducing layer 24$i$ are joined. Thus, the energy band is further bent in a positive direction in a portion in the second semiconductor layer 24$t$ located nearer the junction interface Bo24. In contrast, more electrons 1E are introduced into the conduction band in a portion of the second carrier introducing layer 24$i$ located nearer the junction interface Bo24. Thus, the energy band is further bent in a negative direction in a portion of the second carrier introducing layer 24$i$ located nearer the junction interface Bo24. FIG. 4B shows the Fermi level E24$f$ of the second carrier transporter 24 near the junction interface Bo24. When, for example, holes 1H serving as carriers are transported from the light-absorbing layer 23 to the second semiconductor layer 24t with photoelectric conversion in response to light irradiation in the light-absorbing layer 23, the holes 1H are transported from the second semiconductor layer 24t to the second carrier introducing layer 24i. In the second carrier introducing layer 24i, the holes 1H move toward the second electrode 25 to be sequentially replaced with adjacent electrons. In the second electrode 25, the holes 1H are coupled with free electrons arriving from the first electrode 21 through an external wire. With the operation of the holes 1H, the second carrier transporter 24 can transport the holes 1H serving as carriers from the light-absorbing layer 23 toward the second electrode 25.

The first carrier transporter 22 can transport carriers (electrons) in the same manner as the second carrier transporter 24, although the positive or negative polarity of the carriers is opposite to that in the second carrier transporter 24.

1-2. Method for Manufacturing Solar Cell Element

Figure 5:
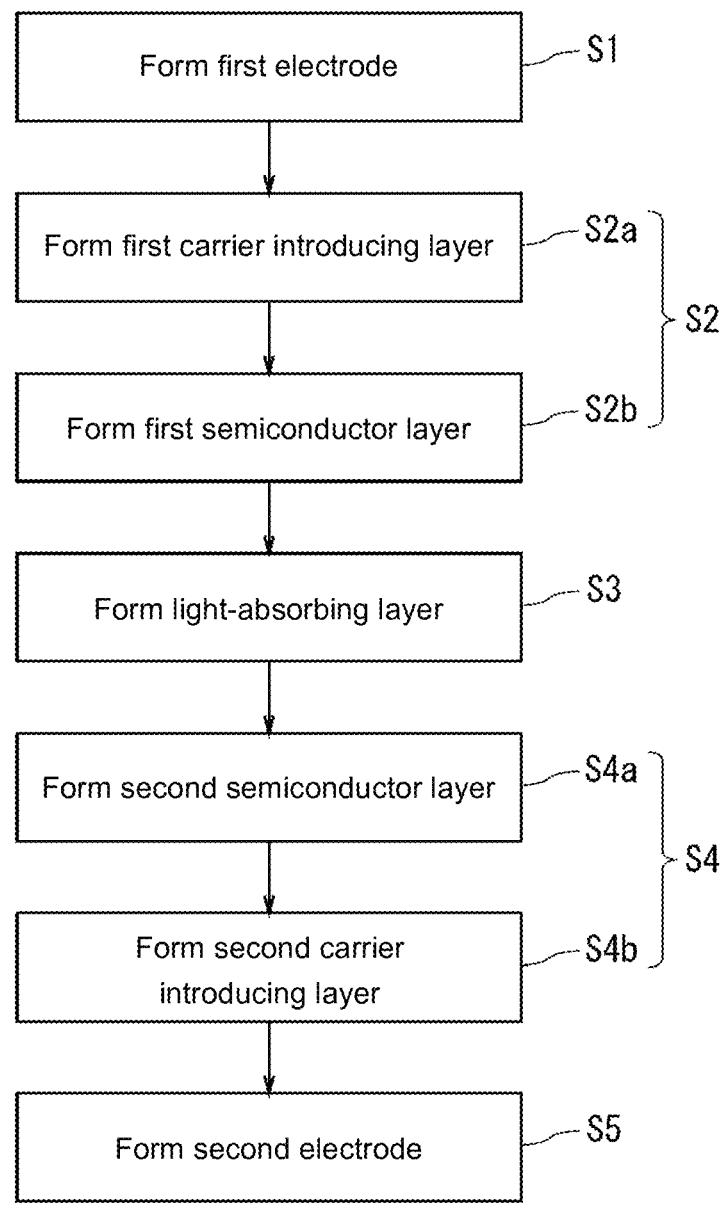
FIG. 5 illustrates a flowchart showing an example method for manufacturing the solar cell element according to the first embodiment.

For example, as shown in FIG. 5, the solar cell element 20 according to the first embodiment can be manufactured by performing steps S1 to S5 in this order.

In step S1, the first electrode 21 is formed on the substrate 1. For example, the first electrode 21 can be formed on the substrate 1 by depositing the material for the first electrode 21 on the substrate 1 with a vacuum process such as sputtering. Examples of the material for the first electrode 21 include TCO such as ITO, FTO, $TiO_2$, $SnO_2$, or ZnO and metal such as Ag, Au, Cu, Ti, In, or Sn.

In step S2, the first carrier transporter 22 is formed on the first electrode 21. The first carrier transporter 22 can be formed on the first electrode 21 by performing steps S2a and S2b in this order.

In step S2a, the first carrier introducing layer 22i is formed on the first electrode 21. The first carrier introducing layer 22i can be formed on the first electrode 21 by, for example, depositing the material for the first carrier introducing layer 22i on the first electrode 21 with a vacuum process such as vapor deposition. Examples of the material for the first carrier introducing layer 22i include $Cs_2CO_3$, LiF, and Ca.

In step S2b, the first semiconductor layer 22t is formed on the first carrier introducing layer 22i. The first carrier introducing layer 22i and the first semiconductor layer 22t are stacked in this order on the first electrode 21 to place the first semiconductor layer 22t into contact with the surface of the first carrier introducing layer 22i facing away from the first electrode 21 to form the first carrier transporter 22. A selected material for the first semiconductor layer 22t may have a larger electron affinity than the ionization potential of the first carrier introducing layer 22i. This structure can avoid, for example, increasing the impurity element density in the first semiconductor layer 22t, and allows the first carrier introducing layer 22i in contact with the first semiconductor layer 22t to introduce electrons into the first semiconductor layer 22t to increase, for example, the electron density (also referred to as carrier density) in the first semiconductor layer 22t. This structure reduces the likelihood of, for example, increasing the resistance loss and recombination loss in the first semiconductor layer 22t. Thus, for example, the solar cell element 20 can improve photoelectric conversion efficiency.

The first semiconductor layer 22t can be formed on the first carrier introducing layer 22i on the substrate 1 by depositing the material for the first semiconductor layer 22t on the first carrier introducing layer 22i on the substrate 1 with a vacuum process such as sputtering. Examples of the material for the first semiconductor layer 22t include metal oxide such as $TiO_2$, $SnO_2$, ZnO, and $In_2O_3$. The first semiconductor layer 22t may be formed on the first carrier introducing layer 22i by, for example, applying, onto the first carrier introducing layer 22i, a liquid material prepared by dissolving a material such as metal chloride or metal isopropoxide into a polar solution, and hydrolyzing the material to produce the metal oxide. Examples of the metal chloride include titanium chloride, tin chloride, zinc chloride, and indium chloride. Examples of metal isopropoxide include titanium isopropoxide, tin isopropoxide, zinc isopropoxide, and indium isopropoxide. More specifically, for example, a titanium tetrachloride solution is applied onto the first carrier introducing layer 22i by, for example, spin-coating, and is dried. The titanium tetrachloride is then hydrolyzed by heating at about 150° C. on a hot plate to form the first semiconductor layer 22t of $TiO_2$ on the first carrier introducing layer 22i.

An organic material may be used as the material for the first semiconductor layer 22t. A fullerene derivative such as [6,6]-Phenyl-$C_{61}$ butyric acid methyl ester (PCBM) may be used as an example of the organic material. In this case, the material may be a liquid material prepared by dissolving the fullerene derivative into a chlorobenzene solvent to contain about 5 to 20 milligrams (mg) of the fullerene derivative in 1 milliliter (1 ml) of the liquid material. In other words, the material may be, for example, a liquid material containing chlorobenzene as a solvent and a fullerene derivative at a density of about 5 to 20 mg/ml. The first semiconductor layer 22t of PCBM may be formed on the first carrier introducing layer 22i by drying and annealing the liquid material applied onto the first carrier introducing layer 22i. For example, the functional group of the organic material used as the material for the first semiconductor layer 22t may be changed to change the physical properties and solubility in organic solvents.

In step S3, the light-absorbing layer 23 is formed on the first carrier transporter 22. The light-absorbing layer 23 can be formed by, for example, applying a liquid material onto the first carrier transporter 22 and annealing the applied liquid material. The liquid material can be formed by, for example, dissolving halide lead or halide tin and halide alkylamine serving as the materials for the light-absorbing layer 23 in the solvent. The light-absorbing layer 23 can be formed from a thin film of a halide perovskite semiconductor with a crystal structure.

In step S4, the second carrier transporter 24 is formed on the light-absorbing layer 23. The second carrier transporter 24 can be formed on the light-absorbing layer 23 by performing steps S4a and S4b in this order.

In step S4a, the second semiconductor layer 24t is formed on the light-absorbing layer 23. In the first embodiment, for example, the second semiconductor layer 24t is placed into contact with the light-absorbing layer 23. For example, the second semiconductor layer 24t can be formed on the light-absorbing layer 23 by applying a liquid material onto the light-absorbing layer 23 and drying and annealing the liquid material. Examples of the material for the second semiconductor layer 24t include an organic semiconductor material such as spiro-OMeTAD, P3HT, PTAA, and poly-TPD. The liquid material can be prepared by dissolving spiro-OMeTAD into chlorobenzene to contain about 10 to 85 mg of spiro-OMeTAD in 1 ml of the liquid material. In other words, for example, a liquid material containing chlorobenzene as a solvent and spiro-OMeTAD at a density of about 10 to 85 mg/ml is used. In some embodiments, the liquid material may be prepared by dissolving P3HT in dichlorobenzene to contain about 5 to 20 mg of P3HT in 1 ml of the liquid material. In other words, for example, a liquid material containing dichlorobenzene as a solvent and P3HT at a density of about 5 to 20 mg/ml may be used. In some embodiments, the liquid material may be prepared by dissolving PTAA in toluene to contain about 5 to 20 mg of PTAA in 1 ml of the liquid material. In other words, for example, a liquid material containing toluene as a solvent and PTAA at a density of about 5 to 20 mg/ml may be used. In some embodiments, the liquid material may be prepared by dissolving poly-TPD in chlorobenzene to contain about 5 to 20 mg of poly-TPD in 1 ml of the liquid material. In other words, for example, a liquid material containing chlorobenzene as a solvent and poly-TPD at a density of 5 to 20 mg/ml may be used.

In step S4b, the second carrier introducing layer 24i is formed on the second semiconductor layer 24t. In the first embodiment, the second carrier introducing layer 24i is formed, for example, to be in contact with the surface of the second semiconductor layer 24t facing away from the light-absorbing layer 23. Thus, the second semiconductor layer 24t and the second carrier introducing layer 24i can be stacked in this order on the light-absorbing layer 23 to place the second carrier introducing layer 24i into contact with the surface of the second semiconductor layer 24tf acing away from the light-absorbing layer 23 to form the second carrier transporter 24. A selected material for the second carrier introducing layer 24i may have a larger electron affinity than the ionization potential of the second semiconductor layer 24t. This structure can avoid, for example, increasing the impurity element density in the second semiconductor layer 24t, and allows the second carrier introducing layer 24i in contact with the second semiconductor layer 24t to introduce holes into the second semiconductor layer 24t to increase, for example, the hole density (also referred to as carrier density) in the second semiconductor layer 24t. This structure reduces the likelihood of, for example, increasing the resistance loss and recombination loss in the second semiconductor layer 24t. Thus, for example, the solar cell element 20 can improve photoelectric conversion efficiency.

The second carrier introducing layer 24i can be formed on the second semiconductor layer 24t by depositing the material for the second carrier introducing layer 24i on the second semiconductor layer 24t with a vacuum process such as vapor deposition. Examples of the material for the second carrier introducing layer 24i include metal oxide such as $MoO_3$, $WO_3$, and $V_2O_5$, and other materials such as $RuO_2$ and $FeCl_3$.

For example, the second carrier introducing layer 24i may be formed on the second semiconductor layer 24t with a process of applying and heating a liquid material. An example of this process includes applying, onto the second semiconductor layer 24t, a liquid material prepared by dissolving a material such as metal chloride or metal isopropoxide into a polar solution, and hydrolyzing the material to produce the metal oxide. Examples of the metal chloride include molybdenum chloride, tungsten chloride, and vanadium chloride. Examples of metal isopropoxide include molybdenum isopropoxide, tungsten isopropoxide, and vanadium isopropoxide. The liquid material can be applied onto the second semiconductor layer 24t by, for example, spin-coating. The material can be hydrolyzed by, for example, heating at about 150° C. on a hot plate.

In step S5, the second electrode 25 is formed on the second carrier transporter 24. For example, the second electrode 25 is formed on the surface of the second carrier introducing layer 24i facing away from the light-absorbing layer 23. The second electrode 25 can be formed on the second carrier transporter 24 by, for example, depositing a material for the second electrode 25 on the second carrier introducing layer 24i with a vacuum process such as sputtering. Examples of the material for the second electrode 25 include a highly conductive metal, such as Au, and TCO such as ITO, FTO, and ZnO.

In the first embodiment, as described above, the first carrier introducing layer 22i and the first semiconductor layer 22t are stacked a single time in the −Z direction serving as the second direction to form the first carrier transporter 22 with a simple structure. Thus, the solar cell element 20 can be manufactured easily. In addition, for example, the contact resistance between the first carrier introducing layer 22i and the first semiconductor layer 22t is less likely to increase with a small interface between the first carrier introducing layer 22i and the first semiconductor layer 22t. Thus, for example, the solar cell element 20 can easily improve photoelectric conversion efficiency. For example, the second semiconductor layer 24t and the second carrier introducing layer 24i are stacked a single time in the −Z direction serving as the second direction to form the second carrier transporter 24 with a simple structure. Thus, for example, the solar cell element 20 can be manufactured easily. In addition, for example, the contact resistance between the second semiconductor layer 24t and the second carrier introducing layer 24i is less likely to increase with a small interface between the second semiconductor layer 24t and the second carrier introducing layer 24i. Thus, for example, the solar cell element 20 can easily improve photoelectric conversion efficiency.

In the first embodiment, the first carrier transporter 22 can be formed by, for example, sequentially forming the first carrier introducing layer 22i and the first semiconductor layer 22t with different deposition processes. In addition, the second carrier transporter 24 can be formed by, for example, sequentially forming the second semiconductor layer 24t and the second carrier introducing layer 24i with different deposition processes. Thus, to form the first carrier transporter 22, the first carrier introducing layer 22i and the first semiconductor layer 22tf or which different deposition processes are suitable can be stacked in this order. In addition, to form the second carrier transporter 24, the second semiconductor layer 24t and the second carrier introducing layer 24i for which different deposition processes are suitable can be stacked in this order. Examples of a combination of different deposition processes include a combination of sputtering and vapor deposition, and a combination of a process of applying and heating a liquid material and sputtering or vapor deposition. For example, for deposition of an organic material such as spiro-OMeTAD, P3HT, PTAA, and poly-TPD, the process of applying and heating a liquid material may be more suitable than a vacuum process such as vapor deposition that may cleave the main chain of the organic material.

Figure 6A:
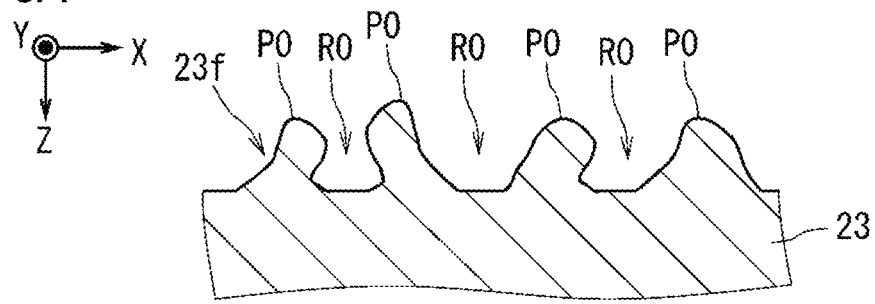
FIG. 6A illustrates a partial cross-sectional view of an example light-absorbing layer.
Figure 6B:
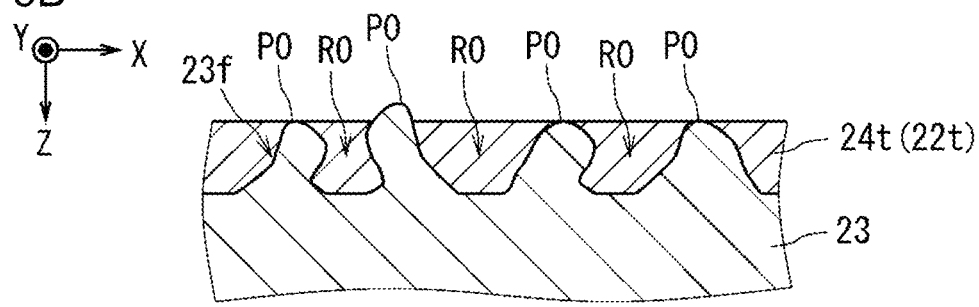
FIG. 6B illustrates a partial cross-sectional view of an example stacked structure including a semiconductor layer on the light-absorbing layer.
Figure 6C:
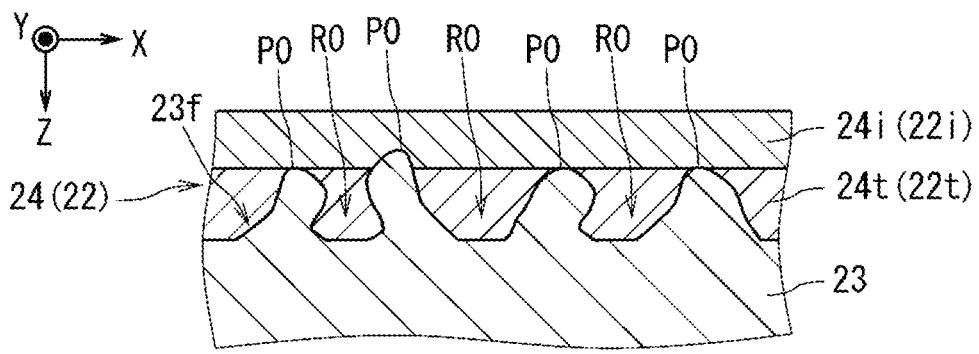
FIG. 6C illustrates a partial cross-sectional view of an example stacked structure including a carrier introducing layer on the semiconductor layer.
Figure 6D:
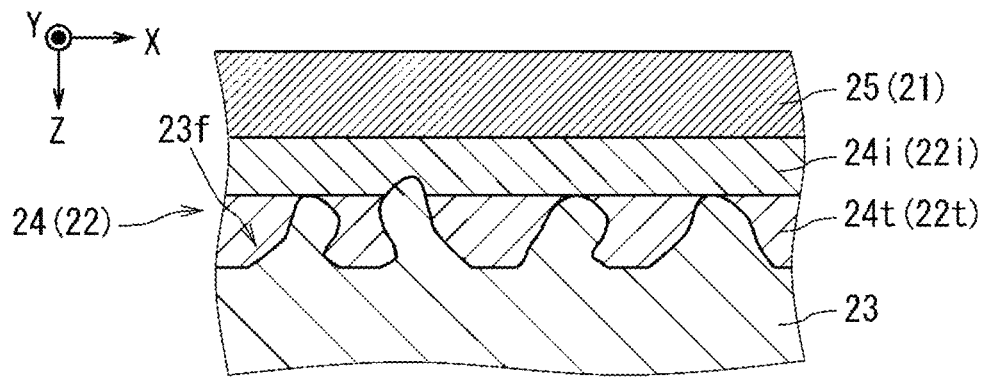
FIG. 6D illustrates a partial cross-sectional view of an example stacked structure including an electrode on the carrier introducing layer.

As shown in, for example, FIG. 6A, irregularities 23f including many recesses R0 and many protrusions P0 may form on the surface of the light-absorbing layer 23 depending on the conditions of forming the light-absorbing layer 23. In other words, for example, the irregularities 23f may form on the surface of the light-absorbing layer 23 facing in the −Z direction serving as the second direction and on which the second carrier transporter 24 is formed. In this case, for example, the second semiconductor layer 24*t* may be formed by applying and heating the liquid material in step S4*a* in step S4, and the second carrier introducing layer 24*i* may be formed by a vacuum process in step S4*b* in step S4. In this structure, as shown in, for example, FIG. 6B, the irregularities 23*f* on the light-absorbing layer 23 can be covered with the second semiconductor layer 24*t*. As shown in, for example, FIG. 6C, the second carrier introducing layer 24*i* may then be formed on the second semiconductor layer 24*t*, and then, as shown in FIG. 6D, the second electrode 25 may be formed on the second carrier introducing layer 24*i*. In step S4*b*, for example, the second carrier introducing layer 24*i* may be formed by applying and heating the liquid material. As shown in, for example, FIGS. 6B and 6C, the irregularities 23*f* may be covered with the second semiconductor layer 24*t* alone, or with the second semiconductor layer 24*t* and the second carrier introducing layer 24*i* on the second semiconductor layer 24*t*. In other words, for example, in the −Z direction serving as the second direction from the light-absorbing layer 23 toward the second electrode 25, the second semiconductor layer 24*t* may have a thickness larger than the height of the irregularities 23*f*, or the total thickness of the second semiconductor layer 24*t* and the second carrier introducing layer 24*i* may be larger than the height of the irregularities 23*f*. In other words, in step S4, the second carrier transporter 24 may have a thickness, in the −Z direction serving as the thickness direction of the light-absorbing layer 23, larger than the height of the irregularities 23*f* on the surface of the light-absorbing layer 23 on which the second carrier transporter 24 is formed (also referred to as a mount surface). For example, the surface of the light-absorbing layer 23 facing in the −Z direction serving as the second direction is used as the mount surface. In the solar cell element 20, for example, the thickness of the second carrier transporter 24 is larger than the height of the irregularities 23*f* on the surface of the light-absorbing layer 23 nearer the second electrode 25 in the −Z direction serving as the second direction from the light-absorbing layer 23 toward the second electrode 25. The many recesses R0 and the many protrusions P0 are formed on the surface of the light-absorbing layer 23 nearer the second carrier transporter 24. In this structure, a distance in the −Z direction serving as the thickness direction of the light-absorbing layer 23 from the bottom of one of the many recesses R0 closest to the first electrode 21 to the apex of one of the many protrusions P0 farthest from the first electrode 21 is used as the height of the irregularities 23*f* in the −Z direction serving as the thickness direction of the light-absorbing layer 23.

The irregularities 23*f* on the surface of the light-absorbing layer 23 can be covered with the second semiconductor layer 24*t* to reduce direct contact between the light-absorbing layer 23 and the second electrode 25, and thus the second carrier transporter 24 can be formed on a wider area on the surface of the light-absorbing layer 23. This structure can reduce, for example, any leak current between the light-absorbing layer 23 and the second electrode 25, and thus can efficiently transport carriers (holes) resulting from photoelectric conversion in the light-absorbing layer 23 to the second electrode 25. Thus, for example, the solar cell element 20 can improve photoelectric conversion efficiency.

In step S4, the vacuum process may be used to form the second semiconductor layer 24*t* in step S4*a* and to form the second carrier introducing layer 24*i* in step S4*b*. More specifically, for example, the same vacuum process such as vapor deposition or sputtering may be used to form the second semiconductor layer 24*t* in step S4*a* and to form the second carrier introducing layer 24*i* in step S4*b*. In this structure, the second semiconductor layer 24*t* and the second carrier introducing layer 24*i* can be consecutively formed with the same deposition device. Thus, for example, the solar cell element 20 can easily improve photoelectric conversion efficiency. In addition to the second semiconductor layer 24*t* and the second carrier introducing layer 24*i*, for example, the second electrode 25 may be formed with the same vacuum process such as vapor deposition. In this structure, for example, the second semiconductor layer 24*t*, the second carrier introducing layer 24*i*, and the second electrode 25 can be consecutively formed with the same deposition device. Thus, for example, the solar cell element 20 can easily improve photoelectric conversion efficiency.

1-3. Overview of First Embodiment

The solar cell element 20 according to the first embodiment includes the first carrier introducing layer 22*i* having, for example, an ionization potential smaller than the electron affinity of the first semiconductor layer 22*t* in contact with the first semiconductor layer 22*t*. This structure can avoid, for example, increasing the impurity element density in the first semiconductor layer 22*t*, and allows, for example, introduction of carriers (electrons) into the first semiconductor layer 22*t* to increase the density of carriers of electrons in the first semiconductor layer 22*t*. This structure reduces the likelihood of, for example, increasing the resistance loss and recombination loss in the first semiconductor layer 22*t*. Thus, for example, the solar cell element 20 can improve photoelectric conversion efficiency.

The solar cell element 20 also includes the second carrier introducing layer 24*i* having, for example, an electron affinity larger than the ionization potential of the second semiconductor layer 24*t* in contact with the second semiconductor layer 24*t*. This structure can avoid, for example, increasing the impurity element density in the second semiconductor layer 24*t*, and allows, for example, introduction of carriers (holes) into the second semiconductor layer 24*t* to increase the density of carriers of holes in the second semiconductor layer 24*t*. This structure reduces the likelihood of, for example, increasing the resistance loss and recombination loss in the second semiconductor layer 24*t*. Thus, for example, the solar cell element 20 can improve photoelectric conversion efficiency.

2. Other Embodiments

The present disclosure is not limited to the above first embodiment and may be changed or modified variously without departing from the spirit and scope of the present disclosure.

2-1. Second Embodiment

Figure 7:
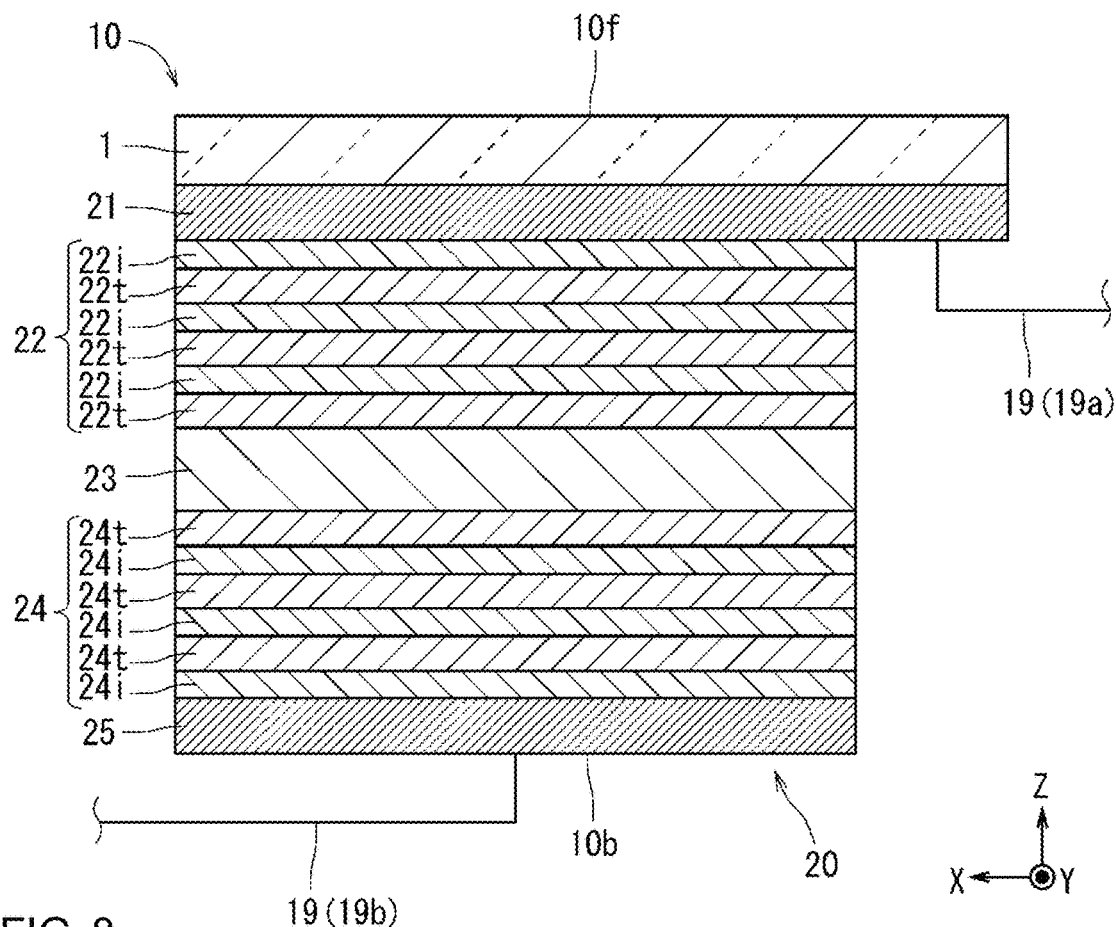
FIG. 7 illustrates a schematic cross-sectional view of an example solar cell element according to a second embodiment.

In the first embodiment, as shown in, for example, FIG. 7, the first carrier transporter 22 may include the first semiconductor layers 22*t* and the first carrier introducing layers 22*i* alternately stacked in the +Z direction serving as the first direction from the light-absorbing layer 23 toward the first electrode 21. The first carrier transporter 22 with this structure can be formed by, for example, alternately forming the first carrier introducing layer 22*i* in step S2*a* in step S2 and the first semiconductor layer 22*t* in step S2*b* in step S2 on the first electrode 21. As shown in, for example, FIG. 7, the second carrier transporter 24 may include the second semiconductor layers 24t and the second carrier introducing layers 24i alternately stacked in the −Z direction serving as the second direction from the light-absorbing layer 23 toward the second electrode 25. The second carrier transporter 24 with this structure can be formed by, for example, alternately forming the second semiconductor layer 24t in step S4a in step S4 and the second carrier introducing layer 24i in step S4b in step S4 on the light-absorbing layer 23.

Each second semiconductor layer 24t into which carriers (holes) can be introduced from the second carrier introducing layer 24i may have a small thickness. In this structure as well, the second carrier transporter 24 including, for example, the second semiconductor layers 24t and the second carrier introducing layers 24i stacked multiple times in the −Z direction serving as the second direction can have a large thickness. Thus, the irregularities 23f on the surface of the light-absorbing layer 23 can be covered with the second carrier transporter 24. This structure can reduce, for example, any leak current between the light-absorbing layer 23 and the second electrode 25. To form the second carrier transporter 24, the second semiconductor layers 24t and the second carrier introducing layers 24i may be alternately stacked in the −Z direction serving as the second direction two or more times for the intended thickness of the second carrier transporter 24. For example, in step S4, the second carrier transporter 24 may have a thickness, in the −Z direction serving as the thickness direction of the light-absorbing layer 23, larger than the height of the irregularities 23f on the surface (mount surface) of the light-absorbing layer 23 on which the second carrier transporter 24 is formed. The surface of the light-absorbing layer 23 facing in the −Z direction serving as the second direction is used as the mount surface. In the solar cell element 20, the thickness of the second carrier transporter 24 in the −Z direction serving as the second direction from the light-absorbing layer 23 toward the second electrode 25 is larger than the height of the irregularities 23f on the surface of the light-absorbing layer 23 nearer the second electrode 25.

2-2. Third Embodiment

In each of the above embodiments, the structure of the solar cell element 20 on the substrate 1 may be upside down. In this structure, for example, the first direction is the −Z direction, and the second direction is the +Z direction.

Figure 8:
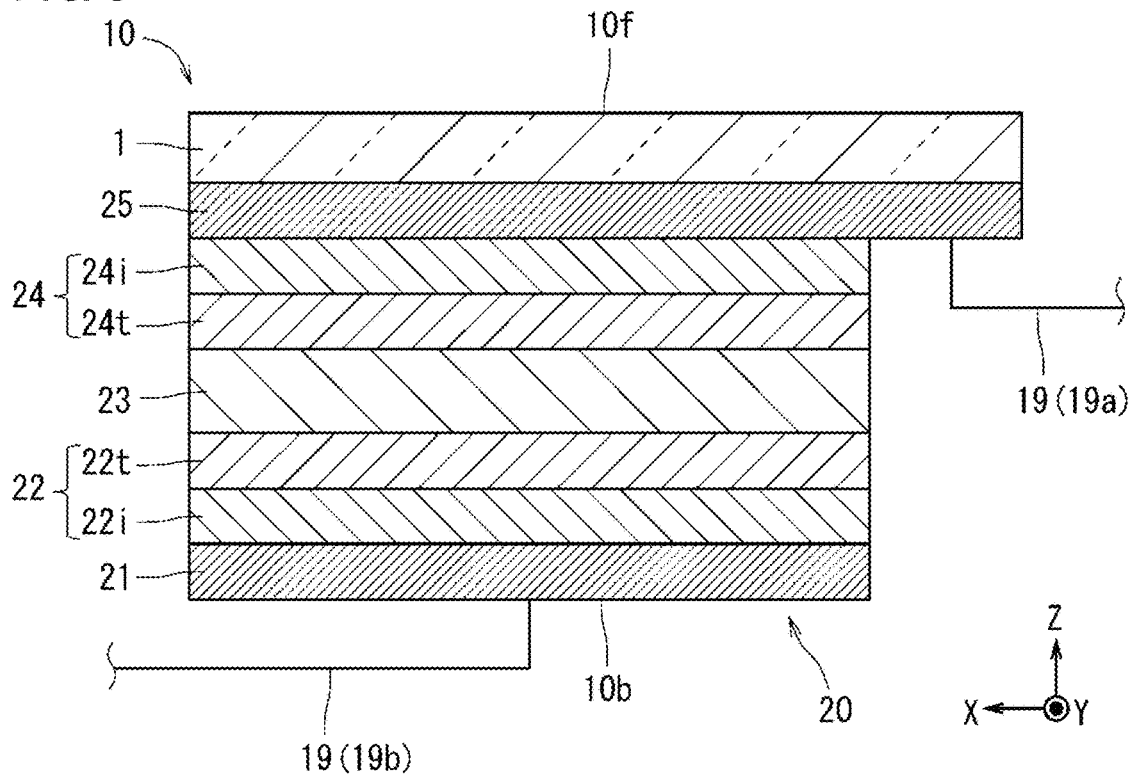
FIG. 8 illustrates a schematic cross-sectional view of an example solar cell element according to a third embodiment.

As shown in, for example, FIG. 8, the second electrode 25, the second carrier transporter 24, the light-absorbing layer 23, the first carrier transporter 22, and the first electrode 21 may be stacked in this order on the substrate 1.

In the example shown in FIG. 8, the second electrode 25 is located on the substrate 1. The second carrier transporter 24 is located on the second electrode 25. The second carrier transporter 24 is located between the second electrode 25 and the light-absorbing layer 23 and includes the second carrier introducing layer 24i and the second semiconductor layer 24t of a second conduction type (p-type). The second carrier introducing layer 24i and the second semiconductor layer 24t are stacked in this order on the second electrode 25. In other words, in the +Z direction serving as the second direction from the light-absorbing layer 23 toward the second electrode 25, the second semiconductor layer 24t and the second carrier introducing layer 24i are stacked in this order. In other words, the second electrode 25 is in contact with the second carrier introducing layer 24i in the second carrier transporter 24, and the second carrier introducing layer 24i is in contact with the surface of the second semiconductor layer 24t nearer the second electrode 25. The electron affinity of the second carrier introducing layer 24i is larger than the ionization potential of the second semiconductor layer 24t. The light-absorbing layer 23 is located between the second electrode 25 and the first electrode 21. The light-absorbing layer 23 is located on the second carrier transporter 24. The surface of the light-absorbing layer 23 nearer the second electrode 25 is in contact with the second semiconductor layer 24t. The first carrier transporter 22 is located between the light-absorbing layer 23 and the first electrode 21 and includes the first semiconductor layer 22t of a first conduction type (n-type) and the first carrier introducing layer 22i. The first semiconductor layer 22t and the first carrier introducing layer 22i are stacked in this order on the light-absorbing layer 23. In other words, the first semiconductor layer 22t and the first carrier introducing layer 22i are stacked in this order in the −Z direction serving as the first direction from the light-absorbing layer 23 toward the first electrode 21. In other words, the light-absorbing layer 23 is in contact with the first semiconductor layer 22t in the first carrier transporter 22, and the first carrier introducing layer 22i is in contact with the surface of the first semiconductor layer 22t nearer the first electrode 21, or facing away from the light-absorbing layer 23. The first carrier introducing layer 22i has an ionization potential smaller than the electron affinity of the first semiconductor layer 22t. The first electrode 21 is located on the first carrier transporter 22.

Figure 9:
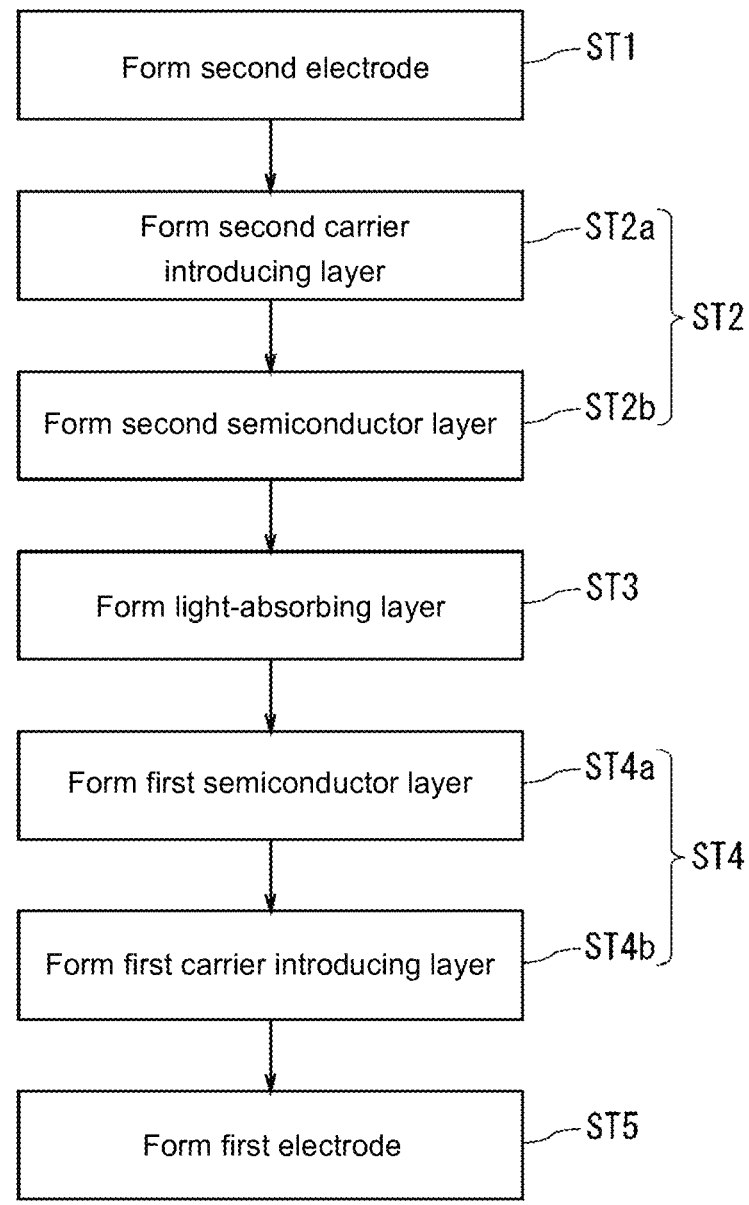
FIG. 9 illustrates a flowchart of an example method for manufacturing a solar cell element according to the third embodiment.

The solar cell element 20 according to the third embodiment with the above structure can be obtained by forming the second electrode 25, the second carrier transporter 24, the light-absorbing layer 23, the first carrier transporter 22, and the first electrode 21 in this order on the substrate 1. More specifically, as shown in FIG. 9, for example, the solar cell element 20 according to the third embodiment can be manufactured by performing steps ST1 to ST5 in this order.

In step ST1, the second electrode 25 is formed on the substrate 1. For example, the second electrode 25 can be formed on the substrate 1 by depositing the material for the second electrode 25 on the substrate 1 with a vacuum process such as sputtering. Examples of the material for the second electrode 25 include a highly conductive metal such as Au and TCO such as ITO, FTO, or ZnO.

In step ST2, the second carrier transporter 24 is formed on the second electrode 25. The second carrier transporter 24 can be formed on the second electrode 25 by performing steps ST2a and ST2b in this order.

In step ST2a, the second carrier introducing layer 24i is formed on the second electrode 25. The second carrier introducing layer 24i can be formed on the second electrode 25 by, for example, depositing the material for the second carrier introducing layer 24i on the second electrode 25 with a vacuum process such as vapor deposition. Examples of the material for the second carrier introducing layer 24i include metal oxide such as $MoO_3$, $WO_3$, and $V_2O_5$, and other materials such as $RuO_2$ and $FeCl_3$. The second carrier introducing layer 24i may be formed on the second electrode 25 by, for example, applying and heating the liquid material.

In step ST2b, the second semiconductor layer 24t is formed on the second carrier introducing layer 24i. The second semiconductor layer 24t can be formed on the second carrier introducing layer 24i by, for example, applying a liquid material onto the second carrier introducing layer 24i and drying and annealing the liquid material. Examples of the material for the second semiconductor layer 24t include an organic semiconductor material such as spiro-OMeTAD, P3HT, PTAA, and poly-TPD. Thus, the second carrier transporter 24 including the second carrier introducing layer 24i and the second semiconductor layer 24t stacked, in the −Z direction serving as the first direction, on the surface of the second carrier introducing layer 24i facing away from the second electrode 25 can be formed. A selected material for the second semiconductor layer 24t may have a smaller ionization potential than the electron affinity of the second carrier introducing layer 24i. This structure can avoid, for example, increasing the impurity element density in the second semiconductor layer 24t, and allows the second carrier introducing layer 24i in contact with the second semiconductor layer 24t to introduce holes into the second semiconductor layer 24t to increase, for example, the hole density (also referred to as carrier density) in the second semiconductor layer 24t. This structure reduces the likelihood of, for example, increasing the resistance loss and recombination loss in the second semiconductor layer 24t. Thus, for example, the solar cell element 20 can improve photoelectric conversion efficiency.

In step ST3, the light-absorbing layer 23 is formed on the second carrier transporter 24. The light-absorbing layer 23 can be formed by, for example, applying a liquid material onto the second carrier transporter 24 and annealing the applied liquid material. The liquid material can be prepared by, for example, dissolving halide alkylamine and halide lead or halide tin serving as the materials for the light-absorbing layer 23 into a solvent.

In step ST4, the first carrier transporter 22 is formed on the light-absorbing layer 23. The first carrier transporter 22 can be formed on the light-absorbing layer 23 by performing steps ST4a and ST4b in this order.

In step ST4a, the first semiconductor layer 22t is formed on the light-absorbing layer 23. In the third embodiment, for example, the first semiconductor layer 22t is placed into contact with the light-absorbing layer 23. The first semiconductor layer 22t can be formed on the light-absorbing layer 23 by depositing the material for the first semiconductor layer 22t on the light-absorbing layer 23 with a vacuum process such as sputtering. Examples of the material for the first semiconductor layer 22t include metal oxide such as $TiO_2$, $SnO_2$, ZnO, and $In_2O_3$. The first semiconductor layer 22t may be formed on the light-absorbing layer 23 by, for example, applying, onto the light-absorbing layer 23, a liquid material prepared by dissolving a material such as metal chloride or metal isopropoxide into a polar solution, and hydrolyzing the material to produce the metal oxide. An organic material may be used as an example of the first semiconductor layer 22t. A fullerene derivative such as PCBM may be used as an example of the organic material. In this case, for example, a liquid material prepared by dissolving PCBM serving as a fullerene derivative into an organic solvent is used. The first semiconductor layer 22t of PCBM may be formed on the light-absorbing layer 23 by drying and annealing the liquid material applied onto the light-absorbing layer 23. For example, the functional group of the organic material used as the material for the first semiconductor layer 22t may be changed to change the physical properties and solubility in organic solvents.

In step ST4b, the first carrier introducing layer 22i is formed on the first semiconductor layer 22t. In the third embodiment, the first carrier introducing layer 22i is formed on, for example, the surface of the first semiconductor layer 22tf acing away from the light-absorbing layer 23. The first carrier introducing layer 22i can be formed on the first semiconductor layer 22t by, for example, depositing the material for the first carrier introducing layer 22i on the first semiconductor layer 22t with a vacuum process such as vapor deposition. Examples of the material for the first carrier introducing layer 22i include $Cs_2CO_3$, LiF, and Ca. Thus, the first carrier transporter 22 can be formed by stacking the first semiconductor layer 22t and the first carrier introducing layer 22i on the light-absorbing layer 23. The first carrier introducing layer 22i is formed on the surface of the first semiconductor layer 22tf acing away from the light-absorbing layer 23. A selected material for the first semiconductor layer 22t may have a smaller ionization potential than the electron affinity of the first semiconductor layer 22t. This structure can avoid, for example, increasing the impurity element density in the first semiconductor layer 22t, and allows the first carrier introducing layer 22i in contact with the first semiconductor layer 22t to introduce electrons into the first semiconductor layer 22t to increase, for example, the electron density (also referred to as carrier density) in the first semiconductor layer 22t. This structure reduces the likelihood of, for example, increasing the resistance loss and recombination loss in the first semiconductor layer 22t. Thus, for example, the solar cell element 20 can improve photoelectric conversion efficiency.

In step ST5, the first electrode 21 is formed on the first carrier transporter 22. In the third embodiment, the first electrode 21 is formed on, for example, the surface of the first carrier introducing layer 22i facing away from the light-absorbing layer 23. For example, the first electrode 21 can be formed on the first carrier transporter 22 by depositing the material for the first electrode 21 on the first carrier transporter 22 with a vacuum process such as sputtering. Examples of the material for the first electrode 21 include TCO such as ITO, FTO, $TiO_2$, $SnO_2$, or ZnO and metal such as Ag, Au, Cu, Ti, In, or Sn.

As described above, when, for example, the first carrier transporter 22 has a simple structure including the first semiconductor layer 22t and the first carrier introducing layer 22i stacked single time in the −Z direction serving as the first direction, the solar cell element 20 can be manufactured easily. In addition, for example, the contact resistance is less likely to increase between the first semiconductor layer 22t and the first carrier introducing layer 22i. Thus, for example, the solar cell element 20 can easily improve photoelectric conversion efficiency.

As described above, when, for example, the second carrier transporter 24 has a simple structure including the second carrier introducing layer 24i and the second semiconductor layer 24t stacked a single time in the −Z direction serving as the first direction, the solar cell element 20 can be manufactured easily. In addition, for example, the contact resistance is less likely to increase between the second carrier introducing layer 24i and the second semiconductor layer 24t. Thus, for example, the solar cell element 20 can easily improve photoelectric conversion efficiency.

As in the first embodiment, the second carrier transporter 24 in the third embodiment can be formed by, for example, sequentially forming the second carrier introducing layer 24i and the second semiconductor layer 24t with different deposition processes. In addition, the first carrier transporter 22 can be formed by, for example, sequentially forming the first semiconductor layer 22t and the first carrier introducing layer 22i with different deposition processes. Thus, to form the second carrier transporter 24, the second carrier introducing layer 24i and the second semiconductor layer 24tf or which different deposition processes are suitable can be stacked in this order. To form the first carrier transporter 22, the first semiconductor layer 22t and the first carrier introducing layer 22i for which different deposition processes are suitable can be stacked in this order. Examples of a combination of different deposition processes include a combination of sputtering and vapor deposition, and a combination of a process of applying and heating a liquid material and sputtering or vapor deposition. For example, for deposition of an organic material such as spiro-OMeTAD, P3HT, PTAA, and poly-TPD, the process of applying and heating a liquid material may be more suitable than a vacuum process such as vapor deposition that may cleave the main chain of the organic material.

As shown in FIG. 6A, irregularities 23f including many recesses R0 and many protrusions P0 may form on the surface of the light-absorbing layer 23 depending on the conditions of forming the light-absorbing layer 23. In this case, for example, the first semiconductor layer 22t may be formed by applying and heating a liquid material in step ST4a in step ST4, and the first carrier introducing layer 22i may be formed by a vacuum process in step ST4b in step ST4. In this structure, as shown in, for example, FIG. 6B, the irregularities 23f on the light-absorbing layer 23 can be covered with the first semiconductor layer 22t. As shown in, for example, FIG. 6C, the first carrier introducing layer 22i may then be formed on the first semiconductor layer 22t, and then, as shown in FIG. 6D, the first electrode 21 may be formed on the first carrier introducing layer 22i. In step S4Tb, for example, the first carrier introducing layer 22i may be formed by applying and heating the liquid material. As shown in, for example, FIGS. 6B and 6C, the irregularities 23f may be covered with the first semiconductor layer 22t alone, or with the first semiconductor layer 22t and the first carrier introducing layer 22i on the first semiconductor layer 22t. In other words, for example, in the −Z direction serving as the first direction from the light-absorbing layer 23 toward the first electrode 21, the first semiconductor layer 22t may have a thickness larger than the height of the irregularities 23f, or the total thickness of the first semiconductor layer 22t and the first carrier introducing layer 22i may be larger than the height of the irregularities 23f. In other words, in step ST4, the first carrier transporter 22 may have a thickness, in the −Z direction serving as the thickness direction of the light-absorbing layer 23, larger than the height of the irregularities 23f on the surface of the light-absorbing layer 23 on which the first carrier transporter 22 is formed (also referred to as a mount surface). For example, the surface of the light-absorbing layer 23 facing in the −Z direction serving as the first direction is used as the mount surface. In the solar cell element 20, for example, the thickness of the first carrier transporter 22 is larger than the height of the irregularities 23f on the surface of the light-absorbing layer 23 nearer the first electrode 21 in the −Z direction serving as the first direction from the light-absorbing layer 23 toward the first electrode 21. The many recesses R0 and the many protrusions P0 are formed on the surface of the light-absorbing layer 23 nearer the first carrier transporter 22. In this structure, a distance in the −Z direction serving as the thickness direction of the light-absorbing layer 23 from the bottom of one of the many recesses R0 closest to the second electrode 25 to the apex of one of the many protrusions P0 farthest from the second electrode 25 is used as the height of the irregularities 23f in the −Z direction serving as the thickness direction of the light-absorbing layer 23.

The irregularities 23f on the surface of the light-absorbing layer 23 can be covered with the first semiconductor layer 22t to reduce direct contact between the light-absorbing layer 23 and the first electrode 21, and thus the first carrier transporter 22 can be formed on a wider area on the surface of the light-absorbing layer 23. This structure can reduce, for example, any leak current between the light-absorbing layer 23 and the first electrode 21, and thus can efficiently transport carriers (electrons) resulting from photoelectric conversion in the light-absorbing layer 23 to the first electrode 21. Thus, for example, the solar cell element 20 can improve photoelectric conversion efficiency.

In step ST4, the vacuum process may be used to form the first semiconductor layer 22t in step ST4a and to form the first carrier introducing layer 22i in step ST4b. More specifically, for example, the same vacuum process such as vapor deposition or sputtering may be used to form the first semiconductor layer 22t in step ST4a and to form the first carrier introducing layer 22i in step ST4b. In this structure, the first semiconductor layer 22t and the first carrier introducing layer 22i can be consecutively formed with the same deposition device. Thus, for example, the solar cell element 20 can easily improve photoelectric conversion efficiency. In addition to the first semiconductor layer 22t and the first carrier introducing layer 22i, for example, the first electrode 21 may be formed with the same vacuum process such as vapor deposition. In this structure, for example, the first semiconductor layer 22t, the first carrier introducing layer 22i, and the first electrode 21 can be consecutively formed with the same deposition device. Thus, for example, the solar cell element 20 can easily improve photoelectric conversion efficiency.

Figure 10:
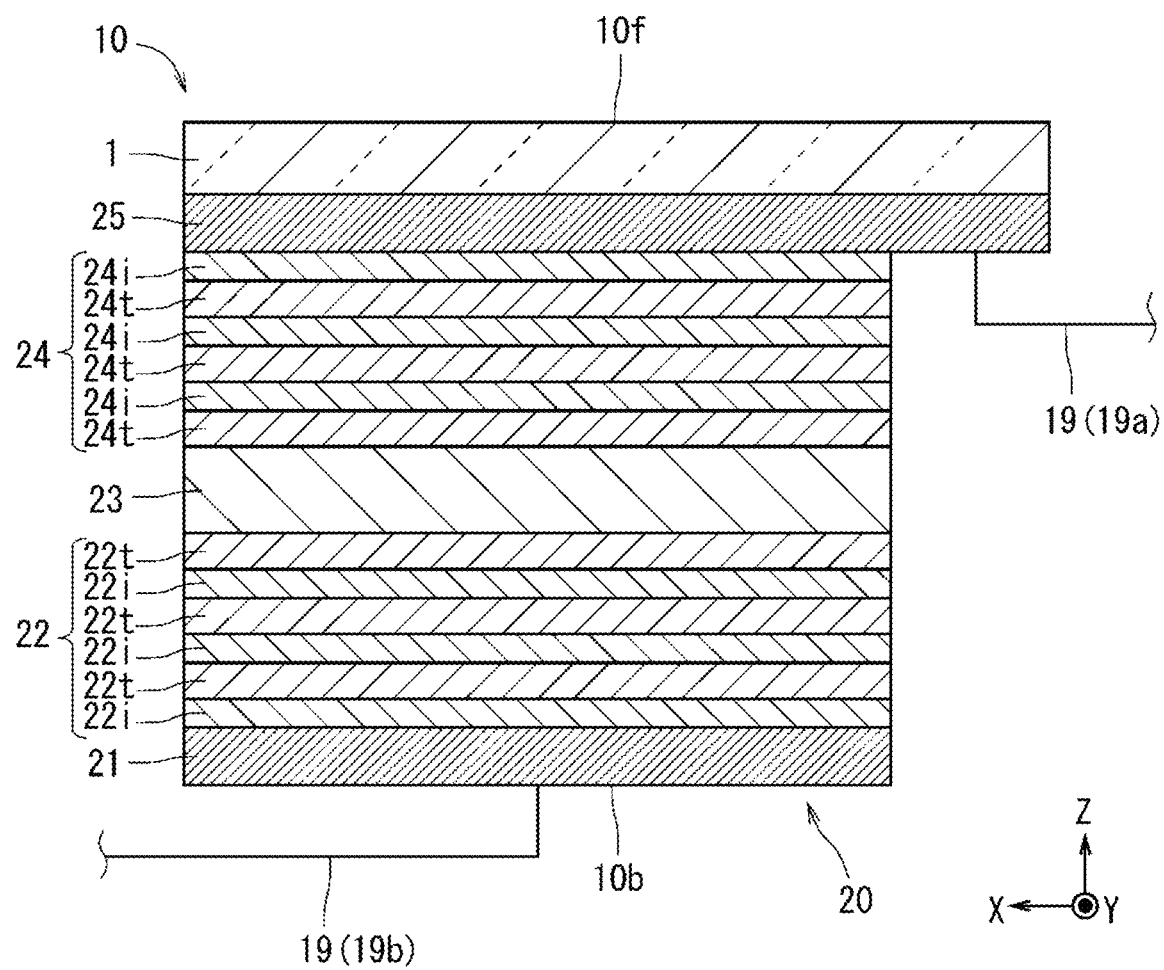
FIG. 10 illustrates a schematic cross-sectional view of another example solar cell element according to the third embodiment.

As shown in, for example, FIG. 10, the second carrier transporter 24 may include the second carrier introducing layers 24i and the second semiconductor layers 24t alternately stacked in the −Z direction serving as the first direction. In other words, the second semiconductor layers 24t and the second carrier introducing layers 24i may be alternately stacked in the +Z direction serving as the second direction from the light-absorbing layer 23 toward the second electrode 25. The second carrier transporter 24 with this structure can be formed by, for example, alternately forming the first carrier introducing layer 22i in step ST2a in step ST2 and the first semiconductor layer 22t in step ST2b in step ST2 on the second electrode 25. Each second semiconductor layer 24t into which carriers (holes) can be introduced from the second carrier introducing layer 24i may have a small thickness. In this structure as well, the second carrier transporter 24 including, for example, the second carrier introducing layers 24i and the second semiconductor layers 24t stacked multiple times in the −Z direction serving as the first direction can have a large thickness.

As shown in, for example, FIG. 10, the first carrier transporter 22 may include the first semiconductor layers 22t and the first carrier introducing layers 22i alternately stacked in the −Z direction serving as the first direction from the light-absorbing layer 23 toward the first electrode 21. The first carrier transporter 22 with this structure can be formed by, for example, alternately stacking the first semiconductor layers 22t in step ST4a in step ST4 and the first carrier introducing layers 22i in step ST4b in step ST4 on the light-absorbing layer 23. Each first semiconductor layer 22t into which carriers (electrons) can be introduced from the first carrier introducing layer 22i may haves a small thickness. In this structure as well, the first carrier transporter 22 including, for example, the first semiconductor layers 22t and the first carrier introducing layers 22i stacked multiple times in the −Z direction serving as the first direction can have a larger thickness. In this structure, for example, the irregularities 23f on the surface of the light-absorbing layer 23 can be covered with the first carrier transporter 22. This structure can thus reduce, for example, any leak current between the light-absorbing layer 23 and the first electrode 21. To form the first carrier transporter 22, the first semiconductor layers 22t and the first carrier introducing layers 22i may be alternately stacked in the −Z direction serving as the first direction two or more times for the intended thickness of the first carrier transporter 22. For example, in step ST4, the first carrier transporter 22 may have a thickness, in the −Z direction serving as the thickness direction of the light-absorbing layer 23, larger than the height of the irregularities 23f on the surface (mount surface) of the light-absorbing layer 23 on which the first carrier transporter 22 is formed. The surface of the light-absorbing layer 23 facing in the −Z direction serving as the first direction is used as the mount surface. In the solar cell element 20, the thickness of the first carrier transporter 22 in the −Z direction serving as the first direction from the light-absorbing layer 23 toward the first electrode 21 is larger than the height of the irregularities 23f on the surface of the light-absorbing layer 23 nearer the first electrode 21.

2-3. Fourth Embodiment

Figure 11A:
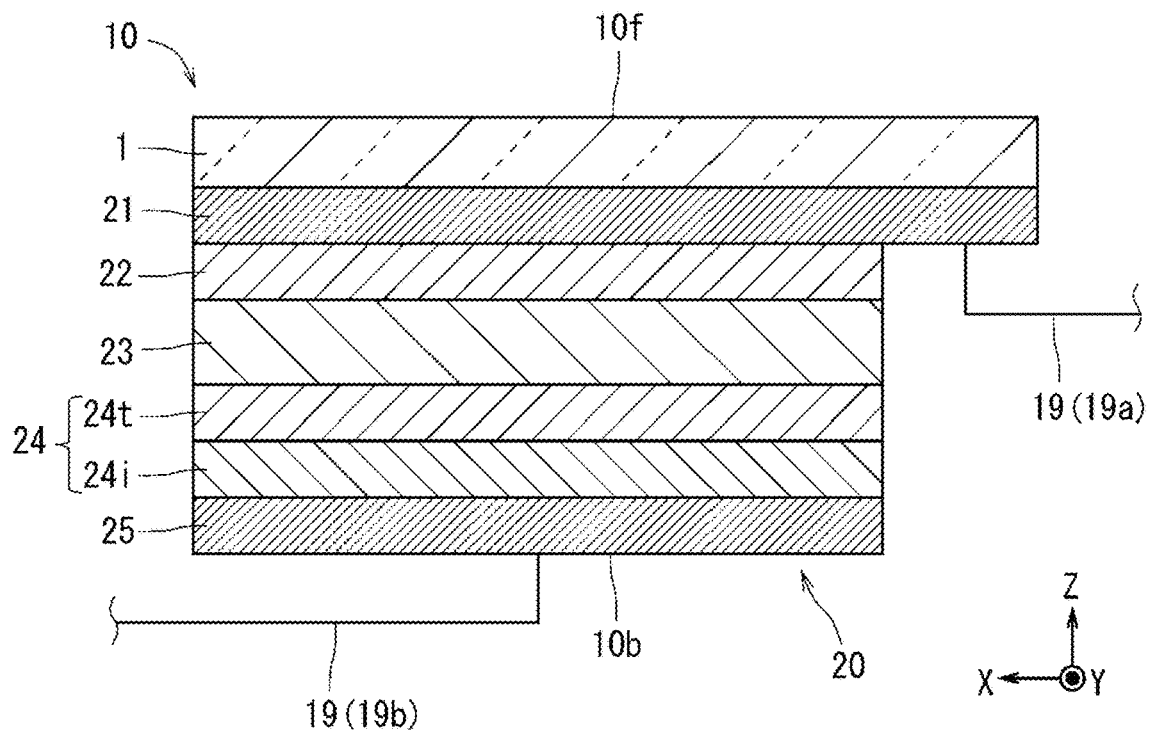
FIG. 11A illustrates a schematic cross-sectional view of an example solar cell element according to a fourth embodiment.

In each of the above embodiments, the first carrier transporter 22 may be a semiconductor layer of a first conduction type (n-type). As shown in FIG. 11A, the first carrier transporter 22 may be formed from a single semiconductor layer.

Figure 11B:
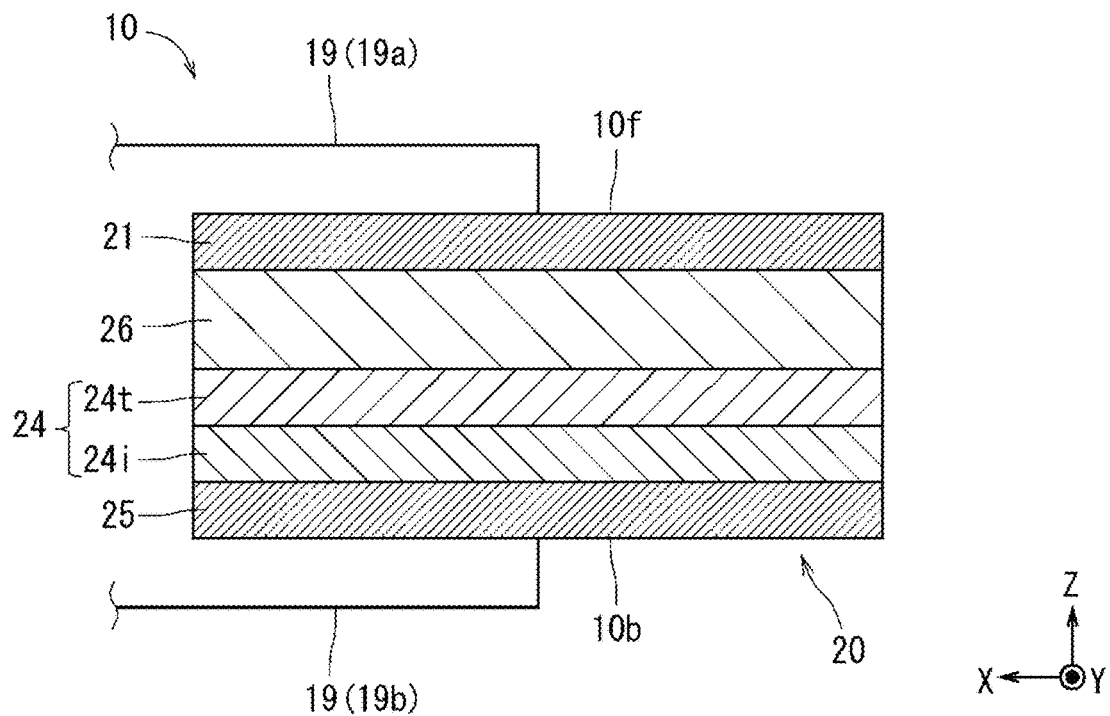
FIG. 11B illustrates a schematic cross-sectional view of another example solar cell element according to the fourth embodiment.

In each of the above embodiments, the first carrier transporter 22 may be eliminated, and the light-absorbing layer 23 may be replaced with a light-absorbing layer 26 of a first conduction type (n-type). For example, as shown in FIG. 11B, the light-absorbing layer 26 of a first conduction type (n-type) may be formed from a single semiconductor substrate. For example, a silicon substrate of a first conduction type (n-type) may be used as the semiconductor substrate.

2-4. Fifth Embodiment

Figure 12A:
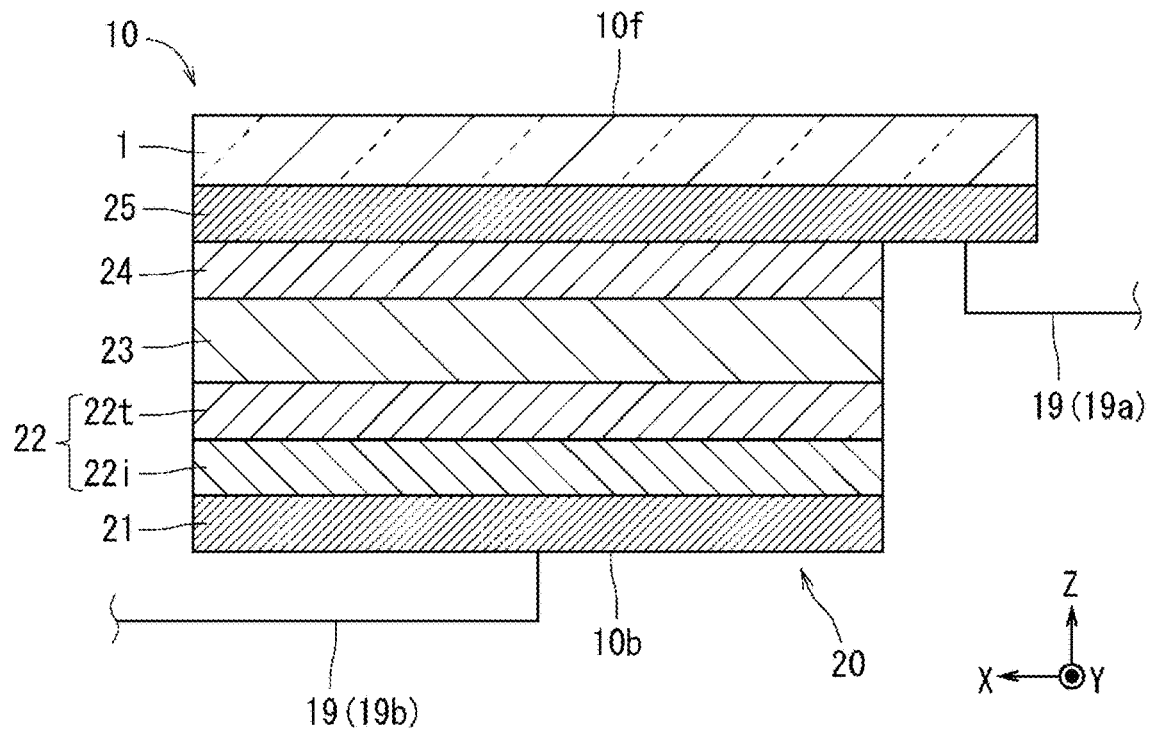
FIG. 12A illustrates a schematic cross-sectional view of an example solar cell element according to a fifth embodiment.

In each of the above embodiments, the second carrier transporter 24 may be a semiconductor layer of a second conduction type (p-type). As shown in FIG. 12A, the second carrier transporter 24 may be formed from a single semiconductor layer.

Figure 12B:
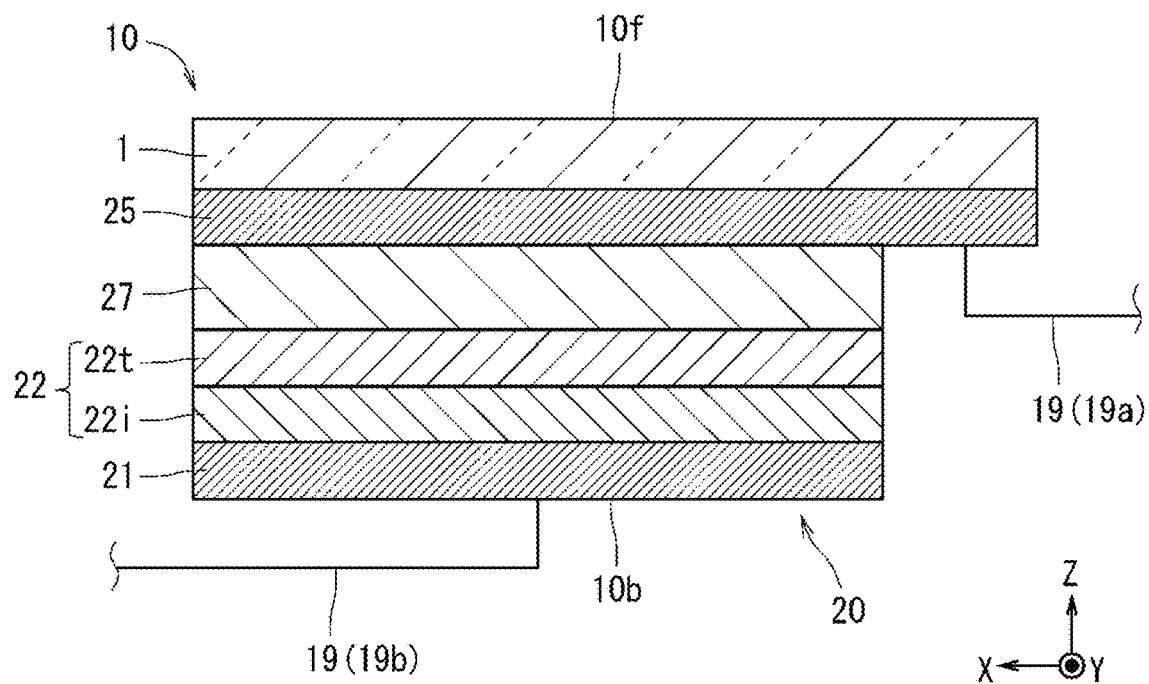
FIG. 12B illustrates a schematic cross-sectional view of another example solar cell element according to the fifth embodiment.

In each of the above embodiments, the second carrier transporter 24 may be eliminated and the light-absorbing layer 23 may be replaced with a light-absorbing layer 27 of a second conduction type (p-type). For example, as shown in FIG. 12B, the light-absorbing layer 27 of a second conduction type (p-type) may be formed from a single semiconductor substrate or a single thin-film semiconductor layer. For example, a silicon substrate of a second conduction type (p-type) may be used as the semiconductor substrate. Examples of the material of a thin-film semiconductor layer include a compound semiconductor with a chalcopyrite structure such as a CIS or CIGS semiconductor of a second conduction type (p-type). The CIS semiconductor is a compound semiconductor containing Cu, In, and selenium (Se). The CIGS semiconductor is a compound semiconductor containing Cu, In, Ga, and Se.

2-5. Sixth Embodiment

Figure 13:
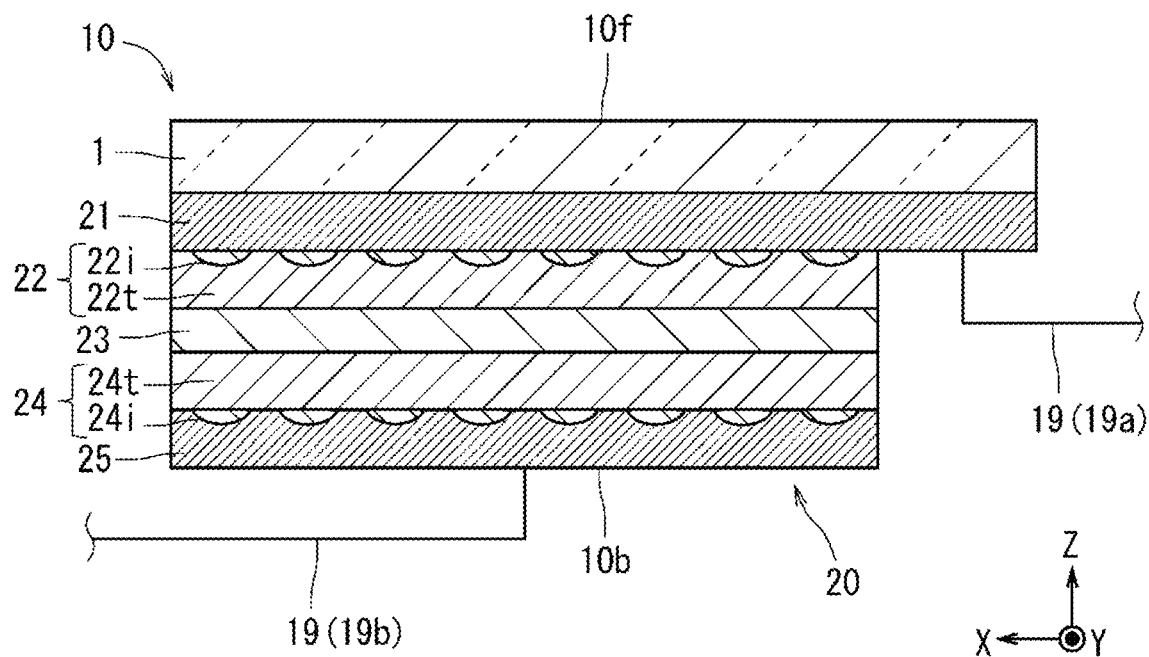
FIG. 13 illustrates a schematic cross-sectional view of an example solar cell element according to a sixth embodiment.

In each of the above embodiments, as shown in FIG. 13, the first carrier introducing layer 22i may have portions dispersed as multiple islands across one surface of the first semiconductor layer 22t. In each of the above embodiments, as shown in FIG. 13, the second carrier introducing layer 24i may have portions dispersed as multiple islands across one surface of the second semiconductor layer 24t.

The components described in the above embodiments and modifications may be entirely or partially combined as appropriate unless any contradiction arises.

The invention claimed is:
1. A solar cell element, comprising:
a first electrode;
a second electrode;
a light-absorbing layer located between the first electrode and the second electrode; and
a first carrier transporter located between the light-absorbing layer and the first electrode,
wherein the first carrier transporter includes a first semiconductor layer of a first conduction type and a first carrier introducing layer stacked in a direction from the light-absorbing layer toward the first electrode,
the first carrier introducing layer is in contact with a surface of the first semiconductor layer nearer the first electrode,
the first carrier introducing layer has an ionization potential smaller than an electron affinity of the first semiconductor layer, and
the first carrier transporter includes a plurality of the first semiconductor layers and a plurality of the first carrier introducing layers alternately stacked in the direction from the light-absorbing layer toward the first electrode.

2. The solar cell element according to claim 1, further comprising:
a second carrier transporter located between the light-absorbing layer and the second electrode, wherein
the second carrier transporter includes a second semiconductor layer of a second conduction type and a second carrier introducing layer stacked in a direction from the light-absorbing layer toward the second electrode,
the second carrier introducing layer is in contact with a surface of the second semiconductor layer nearer the second electrode, and
the second carrier introducing layer has an electron affinity larger than an ionization potential of the second semiconductor layer.

3. The solar cell element according to claim 1, wherein the first carrier transporter has a thickness, in the direction from the light-absorbing layer toward the first electrode, larger than a height of irregularities on a surface of the light-absorbing layer nearer the first electrode.

4. The solar cell element according to claim 2, wherein the second carrier transporter has a thickness, in the direction from the light-absorbing layer toward the second electrode, larger than a height of irregularities on a surface of the light-absorbing layer nearer the second electrode.

5. A solar cell element, comprising:
a first electrode;
a second electrode;
a light-absorbing layer located between the first electrode and the second electrode;
a first carrier transporter located between the light-absorbing layer and the first electrode; and
a second carrier transporter located between the light-absorbing layer and the second electrode,
wherein the first carrier transporter includes a first semiconductor layer of a first conduction type and a first carrier introducing layer stacked in a direction from the light-absorbing layer toward the first electrode, the first carrier introducing layer is in contact with a surface of the first semiconductor layer nearer the first electrode, the first carrier introducing layer has an ionization potential smaller than an electron affinity of the first semiconductor layer, the second carrier transporter includes a second semiconductor layer of a second conduction type and a second carrier introducing layer stacked in a direction from the light-absorbing layer toward the second electrode, the second carrier introducing layer is in contact with a surface of the second semiconductor layer nearer the second electrode, the second carrier introducing layer has an electron affinity larger than an ionization potential of the second semiconductor layer, and the second carrier transporter includes a plurality of the second semiconductor layers and a plurality of the second carrier introducing layers alternately stacked in the direction from the light-absorbing layer toward the second electrode.

6. The solar cell element according to claim 5, wherein the second carrier transporter has a thickness, in the direction from the light-absorbing layer toward the second electrode, larger than a height of irregularities on a surface of the light-absorbing layer nearer the second electrode.

7. A method of manufacturing a solar cell element, comprising:
forming a first carrier transporter by stacking, on a light-absorbing layer,
a first semiconductor layer of a first conduction type and
a first carrier introducing layer to place the first carrier introducing layer into contact with a surface of the first semiconductor layer facing away from the light-absorbing layer, the first carrier introducing layer having an ionization potential smaller than an electron affinity of the first semiconductor layer;
forming a first electrode on the first carrier transporter, wherein the first semiconductor layer and the first carrier introducing layer are stacked in a direction from the light-absorbing layer toward the first electrode, and the first carrier introducing layer is in contact with the surface of the first semiconductor layer nearer the first electrode; and
forming a second electrode, wherein
the forming the first carrier transporter includes alternately stacking a plurality of the first semiconductor layers and a plurality of the first carrier introducing layers on the light-absorbing layer in the direction from the light-absorbing layer toward the first electrode,
the light-absorbing layer is located between the first electrode and the second electrode, and
the first carrier transporter is located between the light-absorbing layer and the first electrode.

8. The method according to claim 7, wherein
the forming the first carrier transporter includes forming the first carrier transporter to have a thickness, in a thickness direction of the light-absorbing layer, larger than a height of irregularities on a surface of the light-absorbing layer on which the first carrier transporter is formed.

9. The method according to claim 7, wherein
the forming the first carrier transporter includes forming the first semiconductor layer by applying and heating a liquid material, and forming the first carrier introducing layer by a vacuum process.

10. The method according to claim 7, wherein
the forming the first carrier transporter includes forming the first semiconductor layer and the first carrier introducing layer by a vacuum process.

11. A method of manufacturing a solar cell element, comprising:
forming a first carrier transporter by stacking, on a first side of a light-absorbing layer,
a first semiconductor layer of a first conduction type and
a first carrier introducing layer to place the first carrier introducing layer into contact with a surface of the first semiconductor layer facing away from the light-absorbing layer, the first carrier introducing layer having an ionization potential smaller than an electron affinity of the first semiconductor layer;
forming a first electrode on the first carrier transporter, wherein the first semiconductor layer and the first carrier introducing layer are stacked in a direction from the light-absorbing layer toward the first electrode, and the first carrier introducing layer is in contact with the surface of the first semiconductor layer nearer the first electrode;
forming a second carrier transporter by stacking, on a second side opposite to the first side of the all light-absorbing layer,
a second semiconductor layer of a second conduction type and
a second carrier introducing layer to place the second carrier introducing layer into contact with a surface of the second semiconductor layer facing away from the light-absorbing layer, the second carrier introducing layer having an electron affinity larger than an ionization potential of the second semiconductor layer; and
forming a second electrode on the second carrier transporter, wherein the second semiconductor layer and the second carrier introducing layer are stacked in a direction from the light-absorbing layer toward the second electrode, and the second carrier introducing layer is in contact with a surface of the second semiconductor layer nearer the second electrode, wherein
the forming the second carrier transporter includes alternately stacking a plurality of the second semiconductor layers and a plurality of the second carrier introducing layers on the light-absorbing layer in the direction from the light-absorbing layer toward the second electrode,
the light-absorbing layer is located between the first electrode and the second electrode;
the first carrier transporter is located between the light-absorbing layer and the first electrode; and
the second carrier transporter is located between the light-absorbing layer and the second electrode.

12. The method according to claim 11, wherein
the forming the second carrier transporter includes forming the second carrier transporter to have a thickness, in a thickness direction of the light-absorbing layer, larger than a height of irregularities on a surface of the light-absorbing layer on which the second carrier transporter is formed.

13. The method according to claim 11, wherein
the forming the second carrier transporter includes forming the second semiconductor layer by applying and heating a liquid material, and forming the second carrier introducing layer by a vacuum process.

14. The method according to claim 11, wherein
the forming the second carrier transporter includes forming the second semiconductor layer and the second carrier introducing layer by a vacuum process.

\* \* \* \* \*